United States Patent [19]
Goebel et al.

[11] Patent Number: 6,097,049
[45] Date of Patent: Aug. 1, 2000

[54] DRAM CELL ARRANGEMENT

[75] Inventors: Bernd Goebel; Eve Marie Martin; Emmerich Bertagnolli, all of Munich, Germany

[73] Assignee: Siemens Aktiengesellschaft, Munich, Germany

[21] Appl. No.: 09/272,077

[22] Filed: Mar. 18, 1999

[30] Foreign Application Priority Data

Mar. 18, 1998 [DE] Germany .......................... 198 11 882

[51] Int. Cl.$^7$ .................................................. H01L 29/76
[52] U.S. Cl. .......................... 257/296; 257/300; 257/301; 257/906; 257/907
[58] Field of Search .................................... 257/296, 300, 257/301, 906, 907

[56] References Cited

U.S. PATENT DOCUMENTS

| | | |
|---|---|---|
| 4,630,088 | 12/1986 | Ogura et al. . |
| 4,737,829 | 4/1988 | Morimoto et al. . |
| 4,949,138 | 8/1990 | Nishimura . |
| 5,307,310 | 4/1994 | Narita . |
| 5,977,589 | 11/1999 | Schloesser ............................. 257/329 |

FOREIGN PATENT DOCUMENTS

| | | |
|---|---|---|
| 0 175 433 | 3/1986 | European Pat. Off. . |
| 0 261 666 | 3/1988 | European Pat. Off. . |
| 195 19 160 C1 | 9/1996 | Germany . |
| 196 20 625 C1 | 10/1997 | Germany . |

OTHER PUBLICATIONS

Semiconductor devices, physics and technology, p. 487.
A Deep–Trenched Capacitor Technology for 4 MEGA Bit Dynamic Ram, E. Yamada et al., pp. 702–705.
Patent Abstracts of Japan—03131064—Apr. 6, 1991.

*Primary Examiner*—Teresa M. Arroyo
*Assistant Examiner*—Rodner M. Jerome
*Attorney, Agent, or Firm*—Hill & Simpson

[57] ABSTRACT

A DRAM cell arrangement and method for manufacturing same, wherein a storage capacitor is connected via a first source/drain zone of a vertical selection transistor and a bit line. Since the storage capacitor and the bit line are arranged substantially above a substrate, the bit line can be manufactured of materials having high electrical conductivity, and materials having a high dielectric constant can be utilized for the storage capacitor. At least the first source/drain zone and a channel zone are parts of a projection-like semiconductor structure that is laterally limited by at least two sidewalls. A respective word line can be arranged at the two sidewalls. An element that prevents the drive of the selection transistor by this word line is arranged between the channel zone and one of the word lines. A second source/drain zone of the selection transistor is buried in the substrate and, for example, is part of a doped layer or of a grid-shaped doped region or is connected to the substrate via a buried contact. A memory cell can be manufactured given open bit lines as well as given folded bit lines, wherein it is manufactured with an area of $4F^2$.

9 Claims, 18 Drawing Sheets

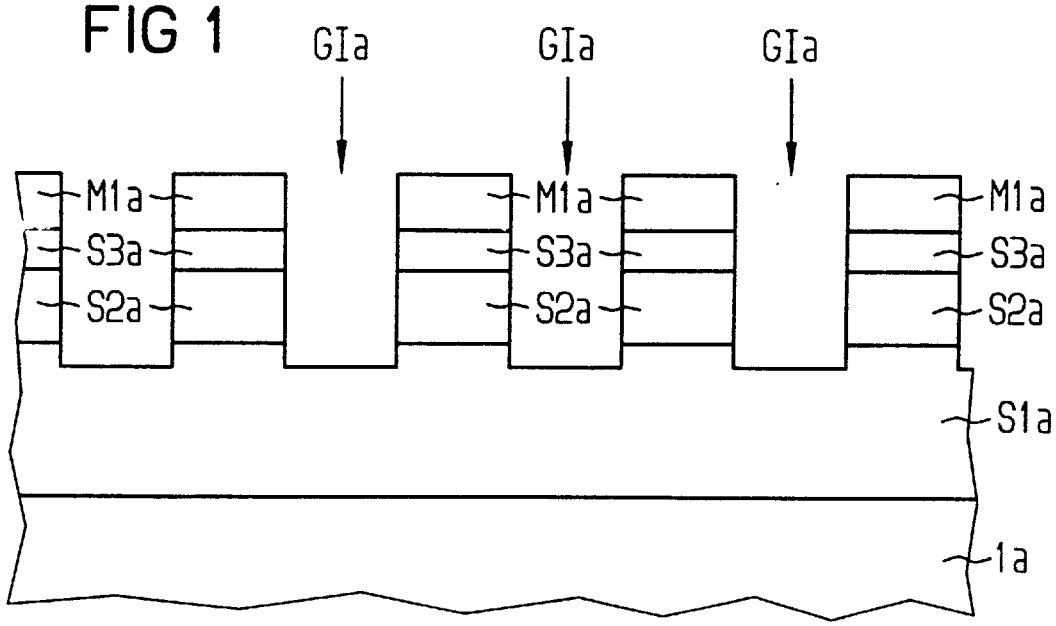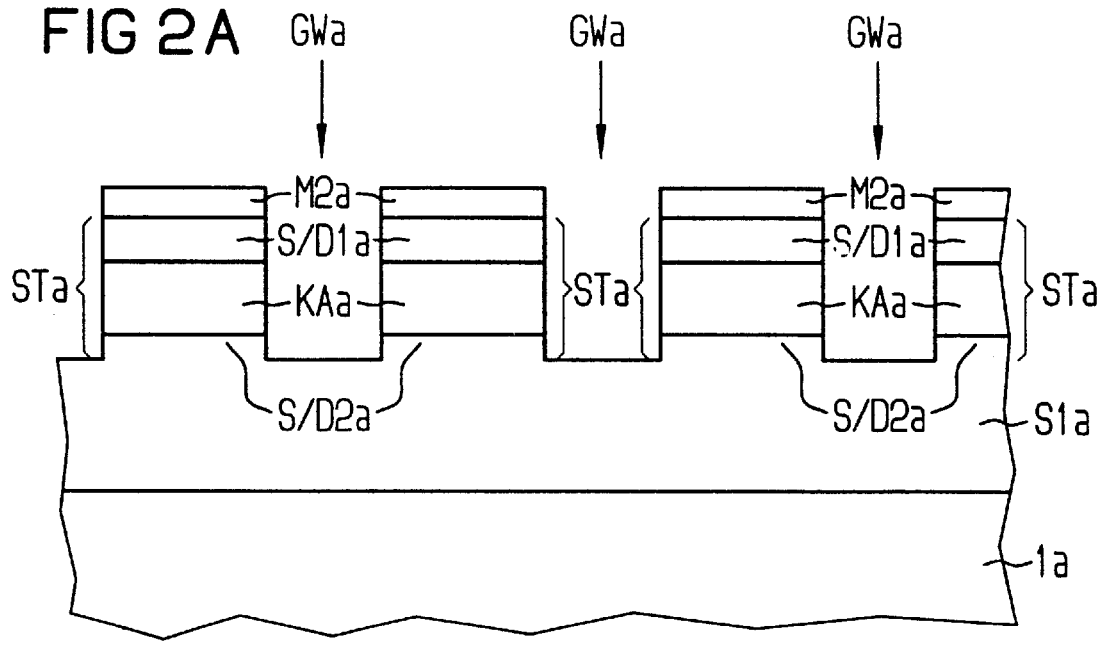

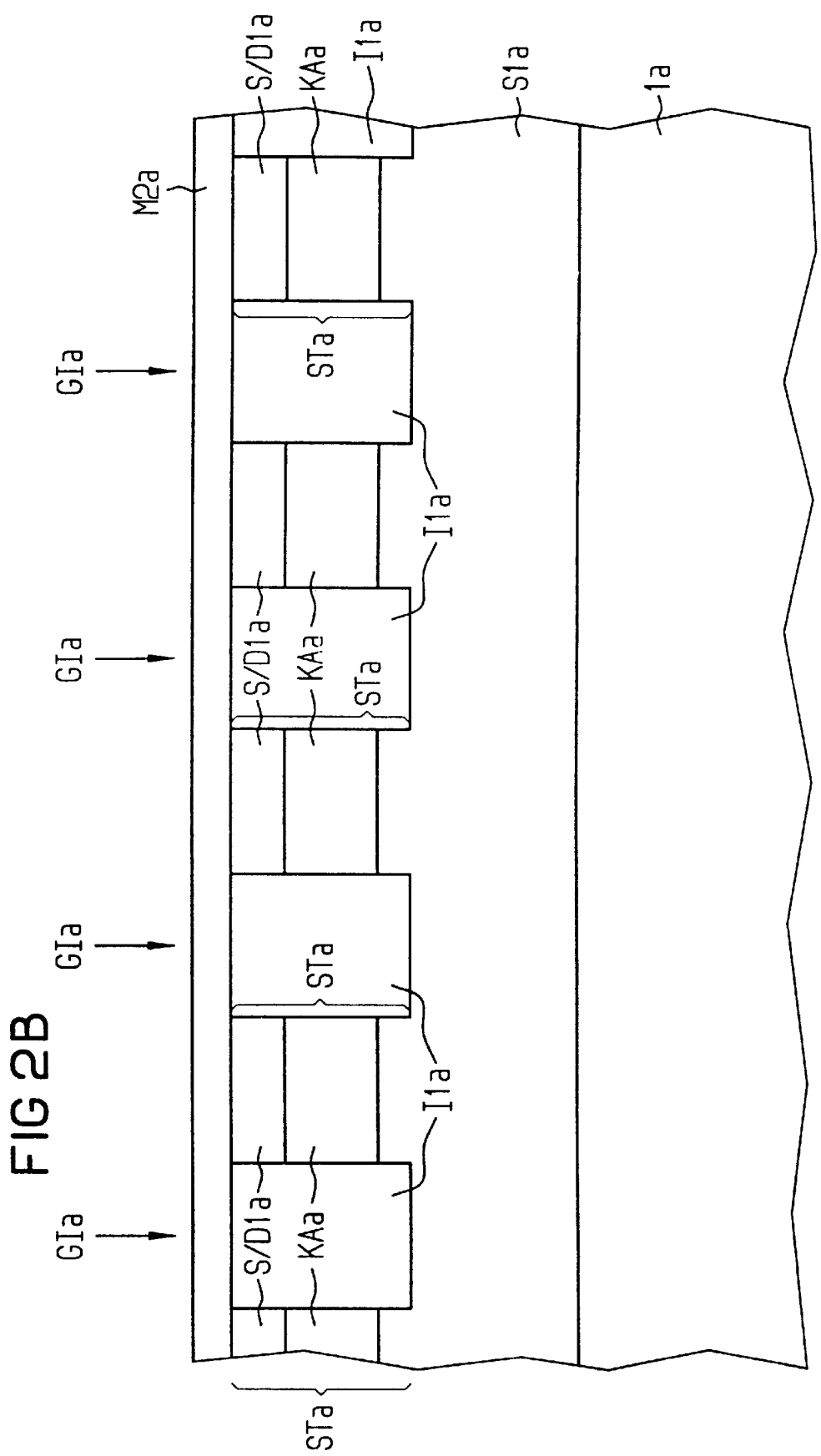

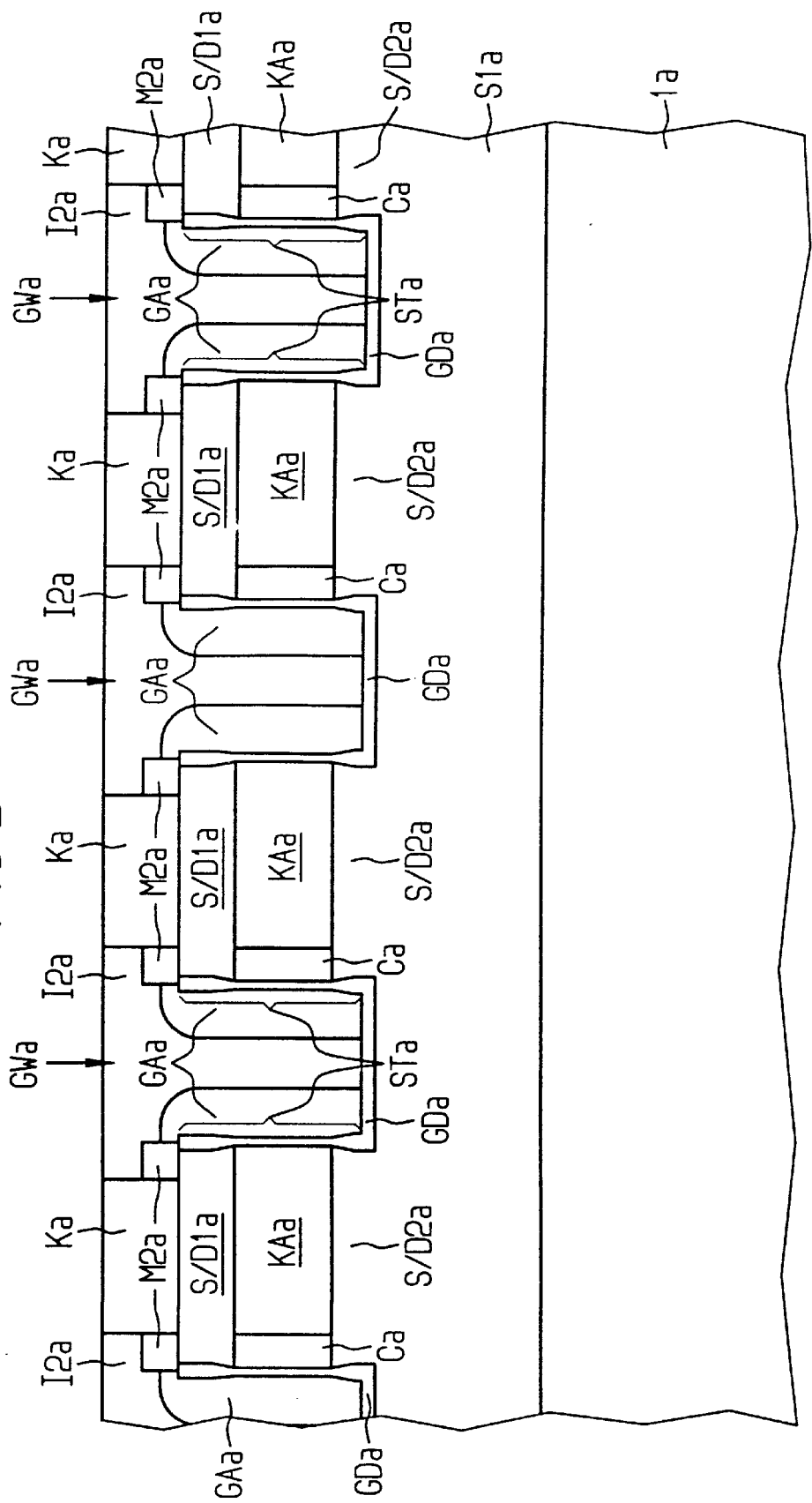

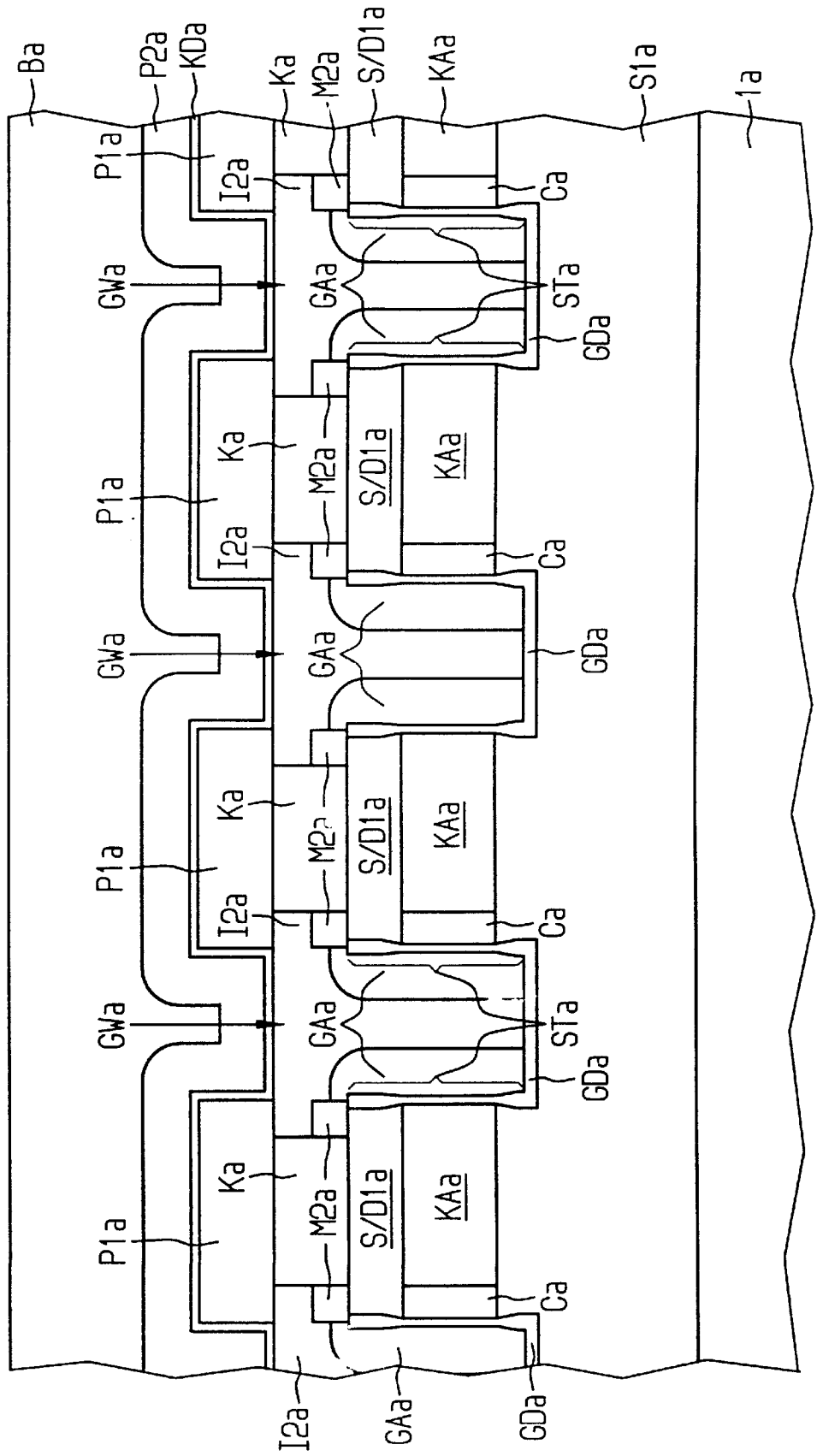

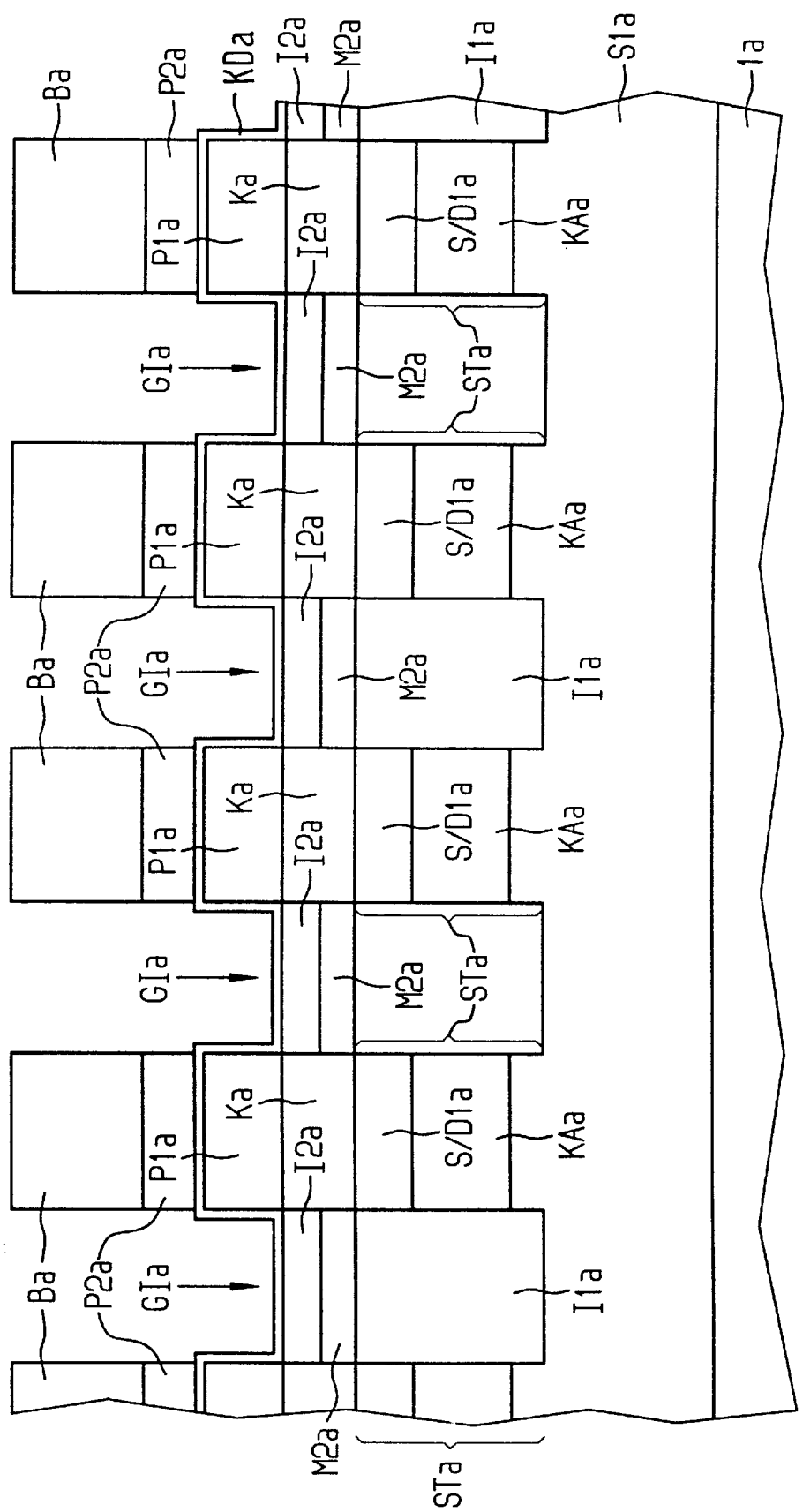

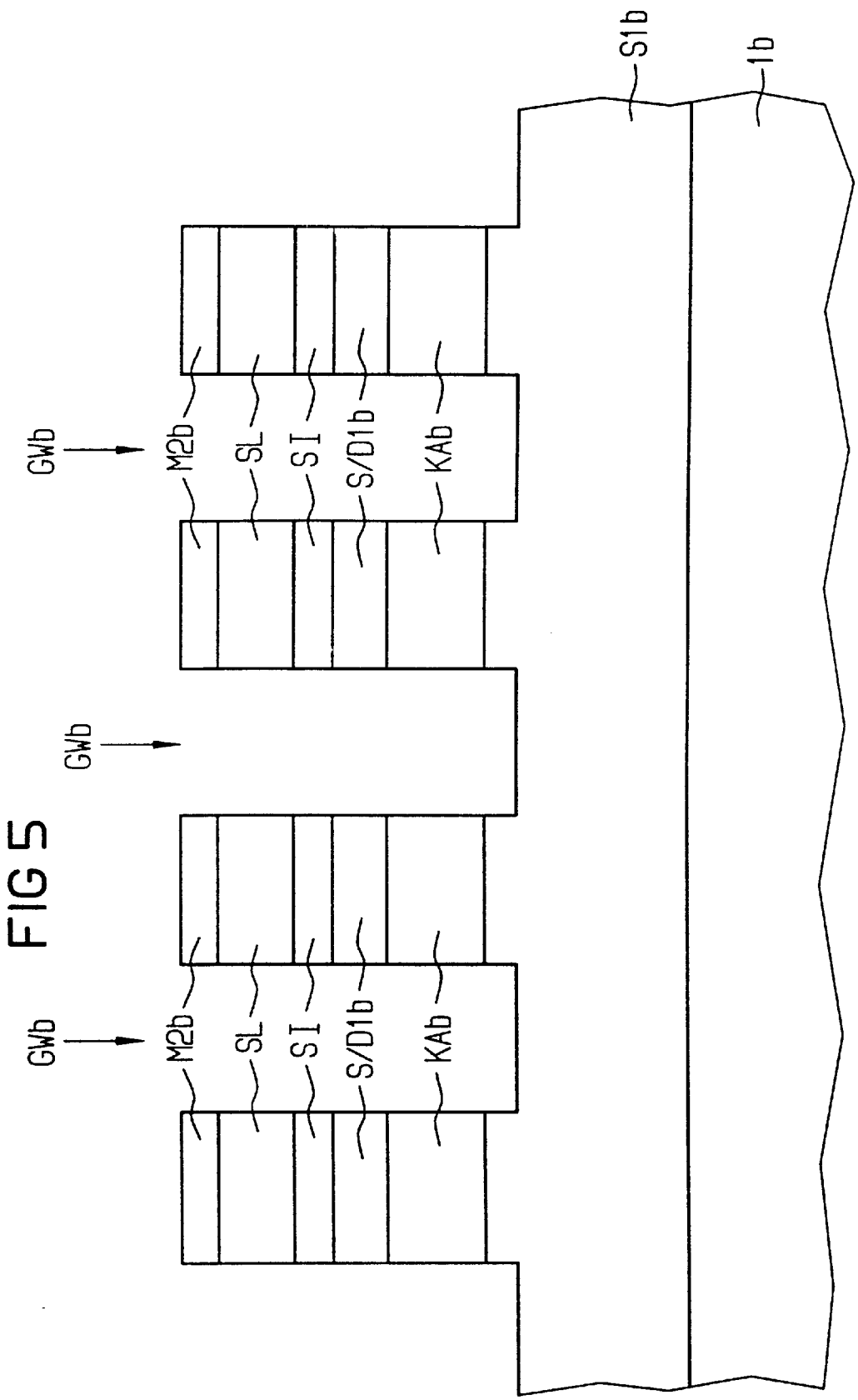

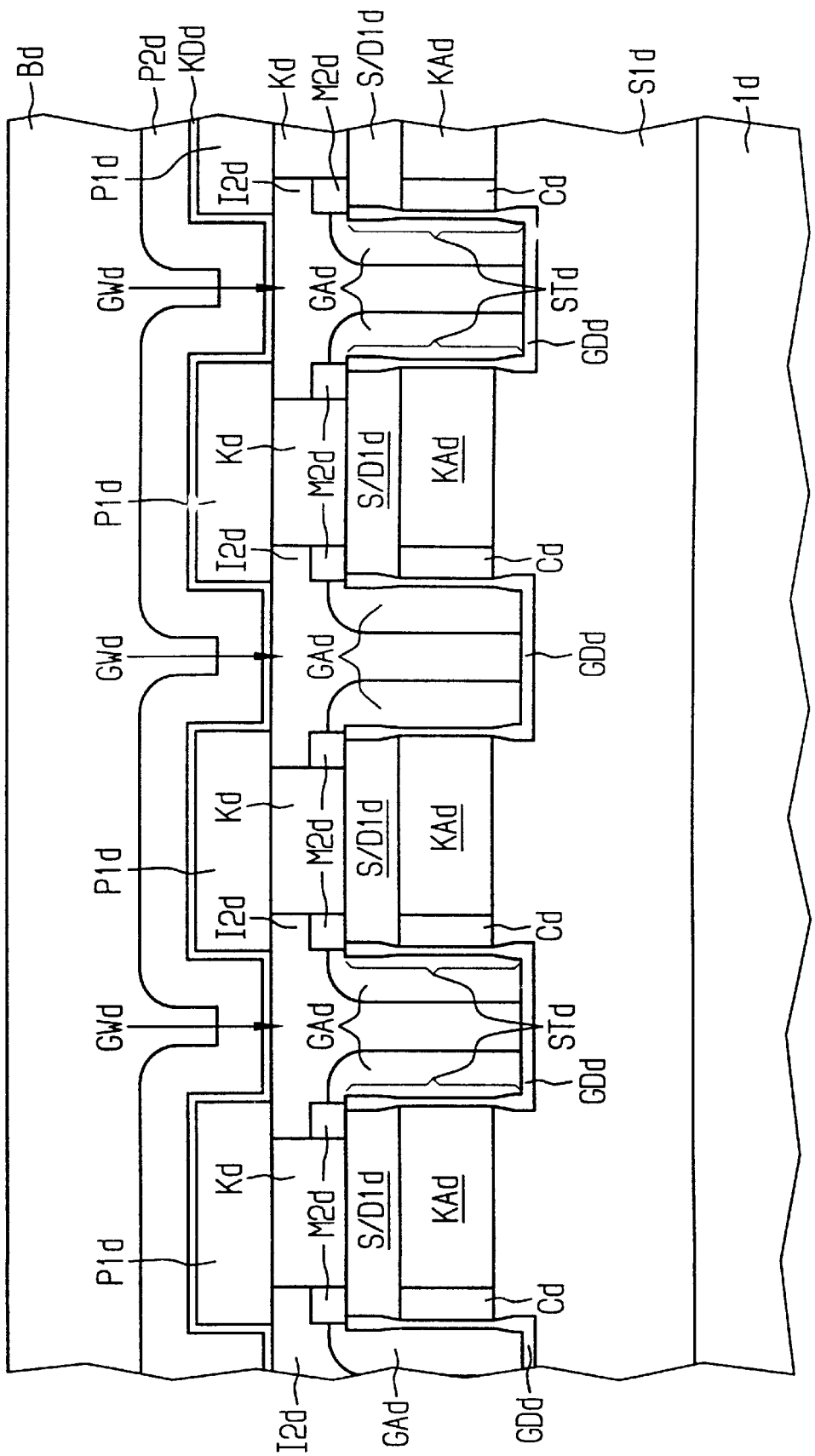

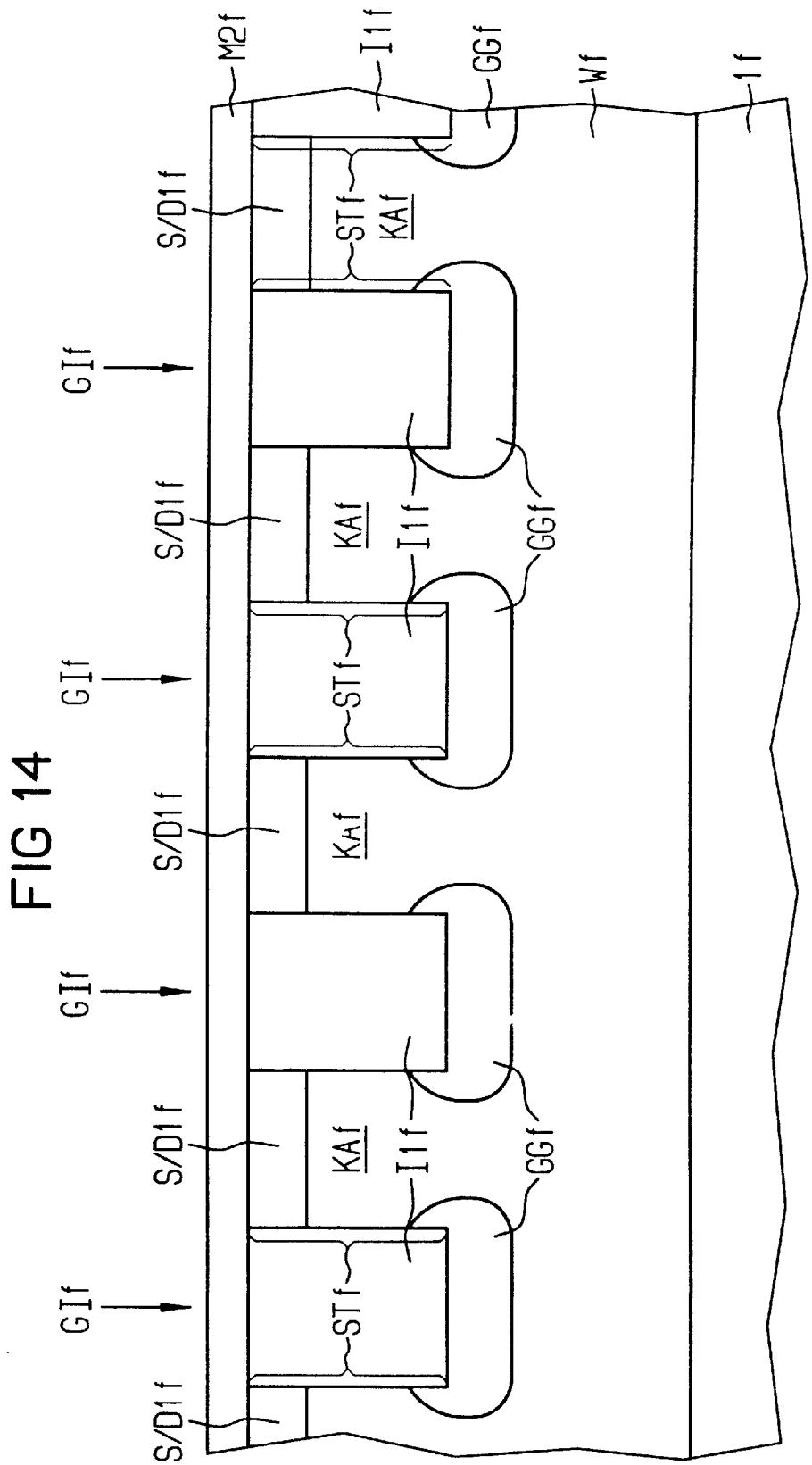

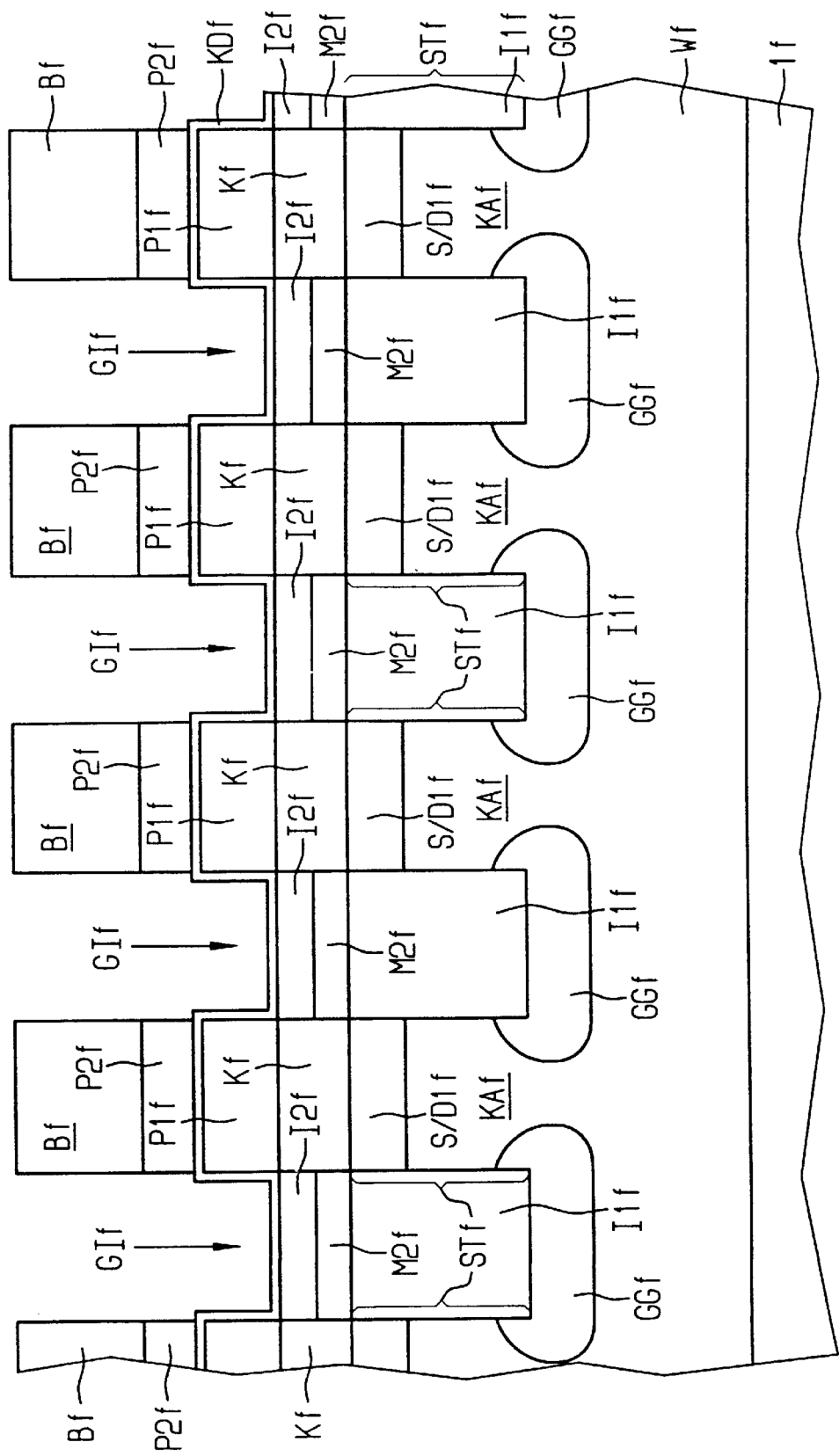

DRAM CELL ARRANGEMENT

BACKGROUND OF THE INVENTION

1. Field of the Invention

The present invention is directed to a DRAM cell arrangement, and method for manufacturing same, wherein a storage capacitor is connected between a selection transistor and a bit line.

2. Description of the Prior Art

In DRAM cell arrangements (i.e., memory cell arrangements having dynamic, random access) what are referred to as one-transistor memory cells are almost exclusively utilized. A one-transistor memory cell includes a selection transistor and a storage capacitor. The information is stored in the storage capacitor in the form of an electrical charge that represents a logical quantity, 0 or 1. This information can be read out via a bit line by driving the selection transistor via a word line.

As a rule, a first source/drain region of the selection transistor is connected to the storage capacitor, and a second source/drain region of the selection transistor is connected to the bit line. A gate electrode of the selection transistor is connected to the word line (see, for example, S. M. Sze, Semiconductor Devices, AT&T Bell Laboratories, Murray Hill, N.J. 1985, page 487, Figure 18a).

Since the memory density is increasing from memory generation to memory generation, the required area of the one-transistor memory cell must be reduced from generation to generation. Since a mere reduction of the dimensions of the memory cell has limits placed on it by the minimum structural size F that can be manufactured in the respective technology, this also involves a modification of the memory cell. Up to the 1-MBit generation, both the selection transistor as well as the storage capacitor were formed as planar components. Beginning with the 4-MBit memory generation, a further reduction in area had to occur by a three-dimensional arrangement of selection transistor and storage capacitor.

One possibility places the storage capacitor not planar, but in a trench (see, for example, K. Yamada et al., "A Deep Trenched Capacitor Technology for 4 MBit DRAMs", Proc. Intern. Electronic Devices and Materials IEDM 85, page 702). The production of such a varied storage capacitor, however, is involved. Further, capacitor dielectrics having high dielectric constants cannot be employed since their deposition is only possible onto substantially planar surfaces.

German Letters Patent 195 19 160 C1 proposes a DRAM cell arrangement wherein the storage capacitor is generated over the selection transistor and the bit line is buried in the substrate. Since the storage capacitor is produced at a service of the substrate, capacitor dielectrics having high dielectric constants can be employed. What is disadvantageous about this DRAM cell arrangement is that the bit line is buried in the substrate. First, it is difficult to produce a buried bit line with low electrical resistance. Second, α-particles that arise in the substrate cause changes of the charge of the bit line, which can lead to a falsification of the information.

U.S. Pat. No. 4,630,088 discloses that the storage capacitor be connected between a first source/drain region of the selection transistor and the bit line. In this way, both bit line as well as the storage capacitor can be formed at a surface of the substrate. Each memory cell includes a projection-like semiconductor structure that is annularly surrounded by a gate electrode. The memory cells are arranged diagonally offset relative to one another with respect to a word line direction. The storage capacitor includes the first source/drain region, a part of a capacitor dielectric deposited surface-wide and a part of the bit line. The first source/drain region, a channel region and a second source/drain region of the selection transistor are arranged above one another in layer-like fashion.

The present invention is based on the problem of specifying a DRAM cell arrangement wherein a storage capacitor is connected between a selection transistor and a bit line and may be manufactured with increased packing density compared to the prior art. Further, a manufacturing method should be specified for such a DRAM cell arrangement.

SUMMARY OF THE INVENTION

A memory cell of an inventive DRAM cell arrangement includes a vertical selection transistor that is arranged at a first sidewall of a projection-like semiconductor structure. The semiconductor structure includes at least a first source/drain region and a channel region of the selection transistor arranged therebelow. At least in the region of the channel zone, the first side wall of the semiconductor structure is provided with a gate dielectric which is adjoined by a gate electrode. The gate electrode is electrically connected to a first word line. An element that prevents the drive of the selection transistor by the second word line is arranged between the channel zone and a second word line. The element that prevents the drive of the selection transistor by the word line arranged at the element adjoins at least a part of a second sidewall of the semiconductor structure lying opposite the first sidewall. The element achieves a high packing density of the DRAM cell arrangement since the second word line that does not drive the selection transistor can be arranged at the semiconductor structure provided with the element. The first source/drain zone is electrically connected to a first capacitor electrode of a storage capacitor. A second capacitor electrode of the capacitor that is arranged over the first capacitor electrode is electrically connected to a bit line that proceeds transverse to the first word line. The capacitor dielectric is arranged between the first capacitor electrode and the second capacitor electrode. A memory cell of an inventive DRAM cell arrangement can be manufactured with an area of $4F^2$.

It is advantageous, for increasing packing density, when the gate electrode is part of the first word line and the first word line proceeds along the first sidewall of the semiconductor structure. Respectively, two word lines neighboring one another are adjacent the same memory cell, but only one of the two word lines drives the selection transistor belonging to the memory cell.

The element that prevents the drive of the selection transistor by the word line arranged at the element can be arranged as a channel stop zone within the semiconductor structure. Since the element that prevents the drive of the selection transistor by the word line arranged at the element is a part of the semiconductor structure, the packing density is especially high. The channel stop region is doped with the same conductivity type as the channel zone but has a higher dopant concentration. Its generation can occur by oblique implantation of the semiconductor structure. Alternatively, the channel stop region can be produced by drive-out of dopant of an auxiliary material that is, in turn, subsequently removed. The channel stop region also can be part of a doped layer of the semiconductor structure. When the layer is doped with a first conductivity type, then the channel zone is produced in this case by, for example, oblique implantation of the doped layer with a second conductivity type opposite the first conductivity type. As a result, a part of the doped layer is oppositely doped with the effect that it exhibits a lower dopant concentration of the first conductivity type than the rest of the doped layer. This part of the layer then acts as channel zone, whereas the rest of the doped layer acts as channel stop region.

The element that prevents the drive of the selection transistor by the word line arranged at the element also may include insulating material that, for example, is structured spacer-shaped by deposition and etching or is generated by thermal oxidation of the part of the second sidewall of the semiconductor structure.

It is advantageous, for increasing the packing density, when a dimension of the element perpendicular to the second sidewall of the semiconductor structure amounts to less than F. Such element preventing the drive of the selection transistor by the word line arranged at the element.

It is advantageous to fashion the DRAM cell arrangement with folded bit lines. Given folded bit lines, the signal of the appertaining bit line is compared to the signal of a neighboring bit line for read-out of the information of the selection transistor. The word line that is driven via the selection transistor dare not be connected to any selection transistor that is connected to the neighboring bit line. By employing folded bit lines, disturbances and signal background, which are very similar for bit lines lying extremely close to one another, can be nearly eliminated. This is very advantageous since the signal that must be evaluated at the bit line becomes smaller and smaller with reduction of the structural size.

For producing folded bit lines, word line trenches proceeding substantially parallel to one another are produced; these separating semiconductor structures from one another. Respectively, two different word lines proceed along the word line trenches. Gate electrodes are parts of the word lines. The elements that prevent the drive of the selection transistor by the word lines arranged at the element, and that belong to memory cells neighboring one another along a first of the word line trenches, adjoin a first sidewall of the first word line trench and a second sidewall of a neighboring, second word line trench in alternation. Each second memory cell of the memory cells neighboring along the first word line trench is connected to the first word line, whereas the other memory cells neighboring along the first word line trench are connected to the second word line. As a result, the first word line via which the selection transistor that is connected to the bit line is driven is connected to no selection transistor that is connected to a bit line neighboring the bit line.

When channel stop regions generated by oblique implantation are utilized for the elements, then implantation can be carried out in one direction first and then in another direction with the assistance of masks.

Elements that prevent the drive of the selection transistors by the word lines arranged at the elements and that belong to memory cells neighboring the bit line can, for example, all be produced either adjoining first sidewalls or adjoining second sidewalls of the word line trenches.

For producing the word lines, it lies within the scope of the present invention to produce the word line trenches with the assistance of a stripe-shaped mask. To that end, a substrate is etched selectively relative to the mask. Surfaces of the word line trenches are provided with a gate dielectric. This can occur, for example, by thermal oxidation or by deposition of insulating material. The word lines in the form of spacers are produced at the sidewalls of the word line trenches by conformal deposition of conductive material that is subsequently selectively etched back relative to the mask. Two word lines adjoining the sidewalls of each and every word line trench are produced self-aligned in this way; i.e., without employing aligning masks. The mask prevents the substrate from being attacked in the re-etching. When the etching process is ended as soon as spacers arise, the mask for generating the word lines can be removed.

For process simplification, it lies within the scope of the present invention to provide open bit lines instead of folded bit lines. In this case, a signal of a bit line is not compared to a signal of a neighboring bit line. Respectively, only one word line is formed along the word line trenches. Elements that prevent the drive of the selection transistors by the word lines arranged at the elements in memory cells neighboring one another along the bit line are all generated either adjoining the first sidewalls or adjoining second sidewalls of the word line trenches. It is thereby assured that memory cells that are connected to the same bit line are respectively driven by different word lines. It is advantageous for process simplification when all elements that prevent the drive of the selection transistor by the word lines arranged at the elements are produced either adjoining the first side walls or adjoining the second sidewalls of the word line trenches. When channel stop regions ads utilized for the elements, implantation must only be carried out obliquely in one direction. Alternatively, the elements that prevent the drive of the selection transistors by the word lines arranged at the elements in memory cells neighboring along a first of the word line trenches can be randomly generated either adjoining the first sidewalls or the second sidewalls of the appertaining semiconductor structures.

In the inventive memory cell arrangement, the memory cells neighboring along the first word line trench can be separated from one another by insulating structures. In this case, the semiconductor structure is formed as a projection of the substrate, and each memory cell includes a semiconductor structure. To that end, insulation trenches proceeding substantially parallel to one another are produced in the substrate or in layers arranged thereon. The word line trenches are produced transverse to the insulation trenches. Due to the production of the insulation trenches and the word line trenches, semiconductor structures arise from the substrate and/or from the layers possibly arranged on it. The insulating structures are arranged in the insulation trenches. To that end, insulating material can be deposited in the insulation trenches before the production of the word line trenches and can be planarized so that the insulation trenches are filled with insulating material. In the production of the word line trenches, both the substrate as well as the insulating material are then etched, so that floors of the word line trenches proceed essentially flat. Instead of being produced in insulation trenches, the insulating structures can be produced in depressions arranged between the memory cells neighboring the first word line trench.

The memory cells neighboring the first word line trench also can be separated from one another with the assistance of further elements that prevent the drive of the selection transistors by the word lines arranged at the elements. In this case, the production of the insulation trenches or of the depressions can be omitted. The semiconductor structure arises from the substrate or from layers arranged thereon, formed as a stripe due to the production of the word line trenches. The semiconductor structure is allocated to the memory cells neighboring the first word line trench. The further elements that prevent the drive of the selection transistors by the word lines arranged at the elements are produced at parts of the first sidewall of the first word line trench and of a second sidewall of a neighboring, second word line trench. As such, these parts are located between the memory cells neighboring the first word line trench. In this way, the formation of a channel between first source/drain zones of different memory cells neighboring the first word line trench is prevented. Without the further elements, parts of the first word line and of the second word line that do not act as gate electrodes of the selection transistors of the memory cells neighboring the first word line trench would act as gate electrodes of parasitic transistors that respectively include two first source/drain zones neighboring one another.

It is advantageous to implement an implantation with the assistance of a stripe-shaped mask, and to subsequently generate the word line trenches transverse to the stripes of the mask. In this way, the individual, first source/drain regions arise in the stripe-shaped semiconductor structures. Second source/drain regions of the selection transistors can be arranged under channel zones or offset diagonally downward relative to the channel zones. The second source/drain zones can be electrically connected to one another.

A first possibility of electrically connecting the second source/drain zones to one another is accomplished by first layer doped with a first conductivity type. A second layer doped with a second conductivity type opposite the first conductivity type is produced above or, respectively, in the first doped layer.

The first doped layer and the second doped layer can be produced by implantation or by epitaxy. As a result, the first source/drain zones of the selection transistors are produced in or, respectively, on the second doped layer. In the production of the word line trenches, the second doped layer is parted. The word line trenches extend into the first doped layer. Parts of the first doped layer that are located within the semiconductor structures serve as second source/drain zones. Since the first doped layer is not parted, all second source/drain zones are electrically connected to one another. The electrical connection via the first doped layer is advantageous since all second source/drain zones are connected to a single potential and the first doped layer includes a larger cross-section and, thus, a lower resistance than, for example, individual doped stripes.

Given the employment of insulation trenches, a second possibility may be accomplished by producing stripe-shaped, doped regions by implantation at the floors of the insulation trenches before deposition of the insulating material. After producing the word line trenches, the floors of the word line trenches are likewise implanted by implantation as a result whereof a grid-shaped, doped region is formed under the insulation trenches together with the stripe-shaped doped regions. Parts of the grid-shape, doped region that adjoin the sidewalls of the semiconductor structure act as second source/drain zones. The second source/drain zones are offset diagonally down with respect to the channel zones. The first source/drain zones can be produced simultaneously with the grid-shaped, doped region. The grid-shaped, doped region has a substantially larger cross-section and, thus, a smaller resistance than individual stripe-shaped, doped regions.

Given the employment of folded bit lines, a third possibility is accomplished by connecting second source/drain zones generated along the floors of the word line trenches to the channel zone via buried contacts. The channel zone is arranged in a well of the substrate that is doped of the same conductivity type as the substrate. As a result, the second source/drain zones are connected to the potential via the substrate. One advantage is that the channel zones are also connected to the substrate and are thus held at a fixed potential. For producing the buried contacts, narrow trenches that part the second source/drain zones and extend into the well are produced within the word line trenches. The narrow trenches are filled with conductive material at least to such an extent that the second source/drain zones adjoin the conductive material. The narrow trenches filled with the conductive material form the buried contacts. It is advantageous to produce doped terminal regions adjoining the narrow trenches in order to prevent a Schottky junction between the buried contacts and the well. This can occur by implantation. Alternatively, a material from which the dopant can be driven out is employed for the conductive material. In this case, dopant of the same conductivity type as that of the substrate is driven out by a tempering step.

It lies within the scope of the present invention to produce a first auxiliary layer of a first material over the semiconductor structures to be produced (i.e., over the substrate or over the first source/drain regions) and to produce a second auxiliary layer of a second material over the first auxiliary layer that can be selectively etched relative to the first material. The word line trenches and, if present, the insulation trenches part the first auxiliary layer and the second auxiliary layer. The second source/drain zones are produced by implantation of the floors of the word line trenches. A gate dielectric that can be etched selectively relative to the second material is produced at surfaces of the word line trenches. After producing the word lines, uncovered parts of the gate dielectric are selectively removed relative to the second auxiliary layer, as a result whereof the floors of the word line trenches are partially uncovered. The second auxiliary layer thereby protects the first auxiliary layer. Subsequently, the narrow trenches are generated by etching the substrate selectively relative to the first material. The second auxiliary layer is thereby removed, and the first auxiliary layer protects the substrate or the first source/drain zones. Upon deposition and re-etching of conductive material for producing the buried contacts, the first auxiliary layer protects parts of the semiconductor structures lying under it. In order to prevent shorts between the buried contacts and the word lines, it is advantageous to conformally deposit and re-etch insulating material after the production of the word lines, whereby parts of the gate dielectric are also removed until parts of the floors of the word line trenches are uncovered. In this way, small protective spacers of insulating material are formed which adjoin the word lines. The first source/drain zones are preferably produced before production of the first auxiliary layer. Alternatively, they are produced after the removal of the first auxiliary layer.

It also lies within the scope of the present invention that the first source/drain zones may serve as first capacitor electrodes of the storage capacitors. For increasing the capacitance of the capacitor, it is advantageous that the first capacitor electrodes are produced of a more conductive material than the first source/drain zones. In this case, the first capacitor electrodes directly adjoin the first source/drain zones or are connected to the first source/drain zones via contacts.

In order to increase the packing density and reduce the process outlay, it is advantageous when the contacts of the first source/drain zones are produced self-aligned adjoining the first source/drain zones; i.e., without employing aligning masks. To that end, a first layer of insulating material is produced over the first source/drain zones and before producing the word line trenches, and a second layer of a third material that can be selectively etched relative to the insulating material is produced. After production of the gate electrodes, insulating material is deposited and planarized until the second layer is uncovered. Uncovered parts of the second layer are removed with the assistance of a stripe-shaped mask whose stripes proceed transverse to the word line trenches and cover the memory cells. When the insulating structures are produced after production of the second layer, the uncovered parts of the second layer are removed without mask. Subsequently, a further insulating material is deposited and planarized until the second layer is uncovered. After this process step, a planar surface is present at which both the insulating material and remaining parts of the second layer adjoin. These parts are arranged above the first source/drain zones. Subsequently, the remaining parts of the second layer are selectively removed relative to the insulating material. As a result, depressions arise above the first source/drain zones. The depressions are displaced downward in that insulating material is etched until the first source/drain zones are uncovered. By deposition, planarization and etching of conductive material, the contacts of the first source/drain zones arise self-aligned in the depressions. When the self-aligned contacts and the buried contacts are provided, the first auxiliary layer is produced on the second layer.

It is advantageous for process simplification when the second capacitor electrode is part of the bit line. For reducing the resistance of the bit line, it is advantageous when the bit line is produced of a more conductive material than the second capacitor electrode. In this case, the second capacitor electrode is not part of the bit line, but it adjoins the bit line or is connected to it via a contact.

Additional features and advantages of the present invention are described in, and will be apparent from, the Detailed Description of the Preferred Embodiments and the Drawings.

DESCRIPTION OF THE DRAWINGS

FIG. 1 shows a cross-section through a first substrate after a first doped layer, a second doped layer, a third doped layer, a first mask and insulating trenches have been produced.

FIG. 2a shows a cross-section perpendicular to the cross-section of FIG. 1 after a second mask, word line trenches, first insulating structures, first source/drain zones, channel zones and second source/drain zones have been produced.

FIG. 2b shows the cross-section of FIG. 1 after the process steps of FIG. 2a.

FIG. 3 shows the cross-section of FIG. 2a after the channel stop regions, a gate dielectric, gate electrodes, word lines, a second insulating structure and contacts have been produced.

FIG. 4a shows the cross-section of FIG. 3 after first capacitor electrodes, a capacitor dielectric, second capacitor electrodes and bit lines have been produced.

FIG. 4b shows the cross-section of FIG. 2b after the process steps of FIG. 4a.

FIG. 5 shows a cross-section through a second substrate after a first doped layer, a second doped layer (not shown), a third doped layer (not shown), a first layer, a second layer with the assistance of a first mask, insulation trenches (not shown), word line trenches, semiconductor structures, first source/drain zones, channel zones and second source/drain zones have been produced, wherein the cross-section proceeds parallel to the insulation trenches.

FIG. 9a shows a cross-section perpendicular to the cross-section of FIG. 8 after a mask, word line trenches, channel stop regions, a gate dielectric, gate electrodes, word lines, and insulating structure, contacts, first capacitor electrodes, a capacitor dielectric, second capacitor electrodes and bit lines have been produced.

FIG. 9b shows a cross-section from FIG. 8 after the process steps of FIG. 9a.

FIG. 14 shows a cross-section through a sixth substrate after a doped layer, insulation trenches, a first part of a grid-shaped region, a first mask, word line trenches (shown in FIG. 15a), semiconductor structures, first source/drain zones, channel zones, second source/drain zones, a second part of the grid-shaped region and first insulating structures have been produced, wherein the cross-section proceeds parallel to the word line trenches.

FIG. 15b shows the cross-section of FIG. 14 after the process steps of FIG. 15a.

DETAILED DESCRIPTION OF THE PREFERRED EMBODIMENTS

Figure 6:
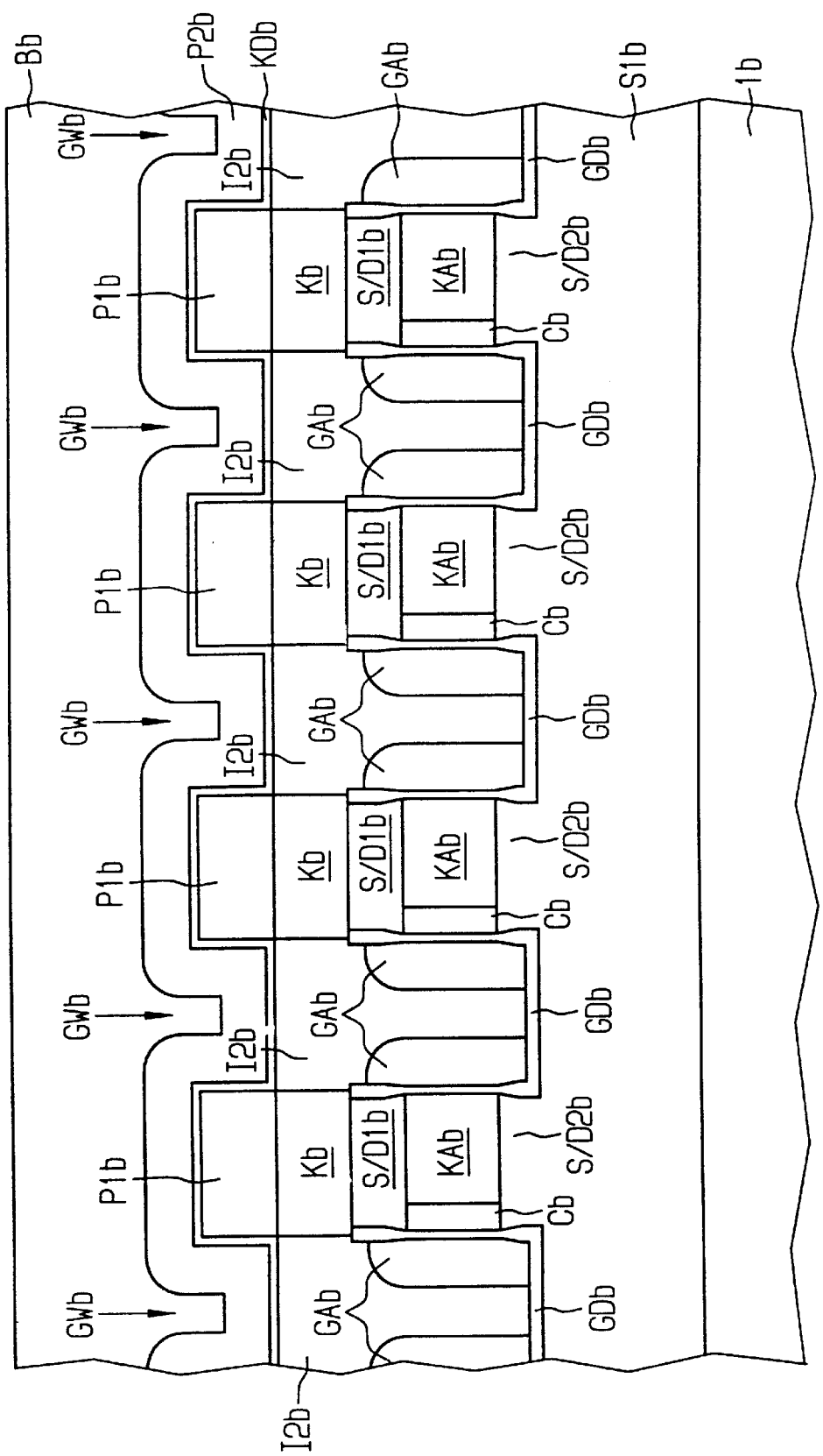
FIG. 6 shows the cross-section of FIG. 5 after channel stop regions, a gate dielectric, gate electrodes, word lines, a second insulating structure, contacts, first capacitor electrodes, a capacitor dielectric, second capacitor electrodes and bit lines have been produced.

In a first exemplary embodiment, an initial material is a first substrate 1a that contains p-doped silicon and whose dopant concentration amounts to approximately $10^{15}$ cm$^{-3}$. An approximately 500 nm thick, first n-doped layer S1a, and an approximately 300 nm thick, second p-doped layer S2a and an approximately 150 nm thick third n-doped layer S3a are produced by epitaxy on the first substrate 1a (see FIG. 1). The dopant concentrations of the first doped layer S1 and of the third doped layer S3a amount to approximately $5 \times 10^{20}$ cm$^{-3}$. The dopant concentration of the second doped layer S2a amounts to approximately $3 \times 10^{17}$ cm$^{-3}$.

For producing a first mask M1a, SiO$_2$ is deposited in a thickness of approximately 200 nm and is structured stripe-shaped by a photolithographic process (see FIG. 1). For example, CHF$_3$+O$_2$ is suitable as etchant for the structuring. Subsequently, silicon is etched approximately 700 nm deep with, for example, HBr+NF$_3$+He+O$_2$, as a result whereof insulation trenches GIa are formed (see FIG. 1). The insulation trenches are approximately 500 nm wide and exhibit a spacing of approximately 500 nm from one another.

For filling the insulation trenches GIa with insulating material, SiO$_2$ is deposited in a thickness of approximately 500 nm in a TEOS process and is planarized by chemical-mechanical polishing until the third doped layer S3a is uncovered. The first mask M1a is thereby removed. For producing a second mask M2a, SiO$_2$ is deposited in a thickness of approximately 100 nm and is structured stripe-shaped by a photolithographic process. The stripes of the second mask M2a proceed perpendicular to the stripes of the first mask M1a. In the structuring, SiO$_2$ is etched approximately 600 nm deep with, for example, CHF$_3$+O$_2$, as a result whereof SiO$_2$ is removed in parts of the insulation trenches GIa. Remaining SiO$_2$ in the insulation trenches GIa form first insulating structures I1a. Subsequently, silicon is etched approximately 600 nm deep, as a result whereof word line trenches GWa are formed (see FIGS. 2a and 2b). The insulation trenches GWa are deeper than the word line trenches GWa. The word line trenches GWa are approximately 500 nm wide and exhibit a spacing of approximately 750 nm from one another. As a result of producing the insulation trenches GIa and the word line trenches GWa, cuboid-shaped semiconductor structures SDa arise from the first substrate 1a. Remaining parts of the third doped layer S3a are arranged in the semiconductor structures STa and serve as first source/drain zones S/D1a. Remaining parts of the second doped layer S2a are arranged in the semiconductor structures SDa and serve as channel zones KAa. Parts of the first doped layer S1a lying under the channel zones KAa serve as second source/drain zones S/D2a. Each semiconductor structure SDa is part of a vertical selection transistor.

With the assistance of a stripe-shaped third mask of photoresist (not shown), whose stripes cover at least every second region lying between neighboring insulation trenches GIa, channel stop regions Ca are produced by oblique implantation adjoining parts of first sidewalls of the word line trenches GWa (see FIG. 3). With the assistance of a fourth mask of photoresist (not shown) complementary to the third mask, channel stop regions are also produced in parts of second sidewalls of the word line trenches GWa. The dopant concentration of the channel stop regions Ca amounts to approximately $10^{19}$ cm$^{-3}$. The channel stop regions Ca are p-doped.

Subsequently, an approximately 10 nm thick gate dielectric GDa is produced by thermal oxidation. For producing word lines, polysilicon doped in situ is deposited in a thickness of approximately 150 nm and is etched back approximately 200 nm deep with, for example, C$_2$F$_6$+O$_2$. The word lines are thereby formed as spacers adjoining the first sidewalls and the second sidewalls of the word line trenches GWa. Parts of the word lines that adjoin parts of the first sidewalls and of the second sidewalls of the word line trenches GWa in the region of the channel zones KAa at which no channel stop regions Ca adjoin act as gate electrodes GAa of selection transistors (see FIG. 3).

For protecting the selection transistors, a second insulating structure I2a is produced that covers the selection transistors wherein SiO$_2$ is deposited in a thickness of approximately 500 nm and is planarized by chemical-mechanical polishing. The first source/drain zones S/D1a are uncovered by a photolithographic process. For example, CHF$_3$+O$_2$ is suitable as etchant. For producing contacts Ka, tungsten is deposited in a thickness of approximately 400 nm and is etched back with, for example, SF$_6$ (see FIG. 3).

For producing a diffusion barrier (not shown), titanium nitride is deposited in a thickness of approximately 20 nm. Subsequently, platinum is deposited in a thickness of approximately 200 nm. For producing first capacitor electrodes P1a separated from one another, platinum is etched with, for example, Cl$_2$+O$_2$ with a photolithographic process. The first capacitor electrodes P1a respectively overlap one of the contacts Ka (see FIGS. 4a and 4b).

For producing a capacitor dielectric KDa, Ba$_{0.5}$St$_{0.5}$TiO$_3$ is deposited in a thickness of 20 nm. Subsequently, platinum is deposited in a thickness of 100 nm. AlSiCu is deposited thereover in a thickness of 500 nm. With the assistance of a stripe-shaped fifth mask (not shown) analogous to the first mask, AlSiCu is etched with, for example, BCl$_3$+Cl$_2$+CH$_4$ and platinum is etched with, for example, Cl$_2$ and O$_2$ for producing bit lines Ba and second capacitor electrodes P2a. The stripes of the fifth mask are arranged between the insulation trenches GIa. The bit lines Ba are arranged over the second capacitor electrodes P2a.

Each memory cell includes a semiconductor structure STa and a storage capacitor arranged over it that includes one of the first capacitor electrodes P1a, a part of the capacitor dielectric KDa and a part of one of the second capacitor electrodes P2a. Channel stop regions Ca of memory cells neighboring a word line trench Gwa are arranged in alternation at a first sidewall of the word line trench GWa and at a second sidewall of a neighboring word line trench GWa. Channel stop regions Ca of memory cells neighboring a bit line Ba are arranged either all adjoining the first sidewalls or the second sidewalls of the word line trenches GWa.

In a second exemplary embodiment, an initial material is a second substrate 1b that contains p-doped silicon and whose dopant concentration amounts to approximately $10^{15}$ cm$^{-3}$. Analogous to the first exemplary embodiment, a first doped layer S1b, a second doped layer (not shown) and a third doped layer (not shown), with the assistance of a first mask (not shown), and insulation trenches (not shown) are produced. As in the first exemplary embodiment, the insulation trenches are filled with SiO$_2$.

A first layer SI is produced on the third doped layer by deposition of SiO$_2$ in a thickness of approximately 100 nm. A second layer SL is produced thereover in a thickness of approximate 300 nm by deposition of polysilicon doped in situ. As in the first exemplary embodiment, SiO$_2$ is deposited in a thickness of approximately 100 nm for producing a stripe-shaped, second mask M2b and is structured with a photolithographic process. The spacings of the stripes of the second mask M2b from one another, however, amount to only 500 nm instead of 750 nm. By etching polysilicon with, for example, C$_2$F$_6$+O$_2$ and by etching SiO$_2$ with, for example CHF3, the second layer SL and the first layer SI are structured analogous to the second mask M2b (see FIG. 5). Analogous to the first exemplary embodiment, word line trenches GWb are produced, as a result whereof first insulating structures (not shown), semiconductor structure Stb, first source/drain zones S/D1b, channel zones KAb and second source/drain zones S/D2b arise (see FIG. 5).

Analogous to the first exemplary embodiment, channel stop regions Cb, a gate dielectric GDb, gate electrodes GAb and word lines are produced. Subsequently, SiO$_2$ is deposited in a thickness of approximately 500 nm for producing a second insulating structure 12b and is planarized by chemical-mechanical polishing until the second layer SL is uncovered. The second mask M2b is thereby removed. With the assistance of a stripe-shaped mask (not shown) that does not cover the insulation trenches, polysilicon is etched selectively relative to SiO$_2$ with, for example, C$_2$F$_6$+O$_2$ until parts of the second layer SL arranged above the insulation trenches are removed. Remaining parts of the second layer SL are arranged above the first source/drain zones S/D1b.

Subsequently, SiO$_2$ is deposited in a thickness of approximately 500 nm and is planarized by chemical-mechanical polishing until the second layer SL is uncovered. By etching polysilicon selectively to SiO$_2$, the second layer SL is removed. Depressions thereby arise above the first source/drain zones S/D1b. Subsequently, SiO$_2$ is etched with, for example, CHF$_3$+O$_2$ until parts of the first layer SI are removed and the first source/drain zones S/D1 are uncovered. As a result of this step, the depressions lying above the first source/drain zones S/D1b are shifted downward. These depressions are filled in wherein polysilicon doped in situ is deposited in a thickness of approximately 500 nm and is planarized by chemical-mechanical polishing until the second insulating structure 12b is uncovered. As a result thereof, contacts Kb of polysilicon arise in the depressions (see FIG. 6). No mask is required for producing the contacts Kb. The contacts Kb are produced self-aligned adjoining the first source/drain zones S/D1b. Analogous to the first exemplary embodiment, first capacitor electrodes P1b, a capacitor dielectric KDb, second capacitor electrodes P2b and bit lines Bb are produced (see FIG. 6).

In a third exemplary embodiment, an initial material is a third substrate 1c that contains p-doped silicon and whose dopant concentration amounts to approximately 10$^{15}$ cm$^{-3}$. Analogous to the first exemplary embodiment, a first doped layer S1c, a second doped layer, a third doped layer insulation trenches (not shown) with the assistance of a first mask, a second mask M2c, word line trenches GWc, semiconductor structures SDc, first source/drain zones S/D1c, channel zones KAc, second source/drain zones S/D2c and first insulating structures (not shown) are produced.

Channel stop regions Cc adjoining first sidewalls of the word line trenches GWc are produced by oblique implantation without mask. The dopant concentration of the channel stop regions Cc amount to approximately 10$^{19}$ cm$^{-3}$. The channel stop regions Cc are p-doped.

Figure 7:
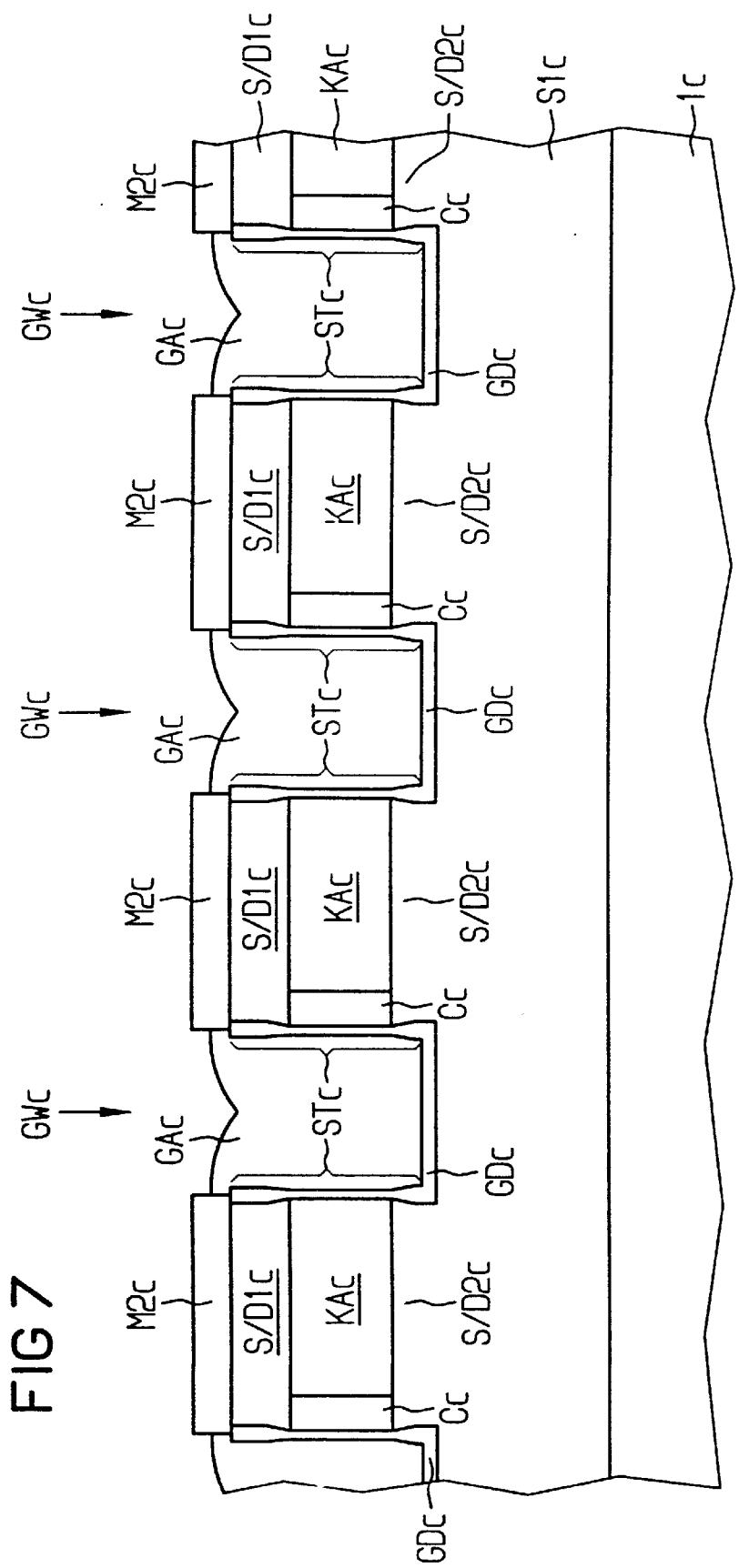
FIG. 7 shows a cross-section through a third substrate after a first doped layer, with the assistance of a first mask, insulation trenches (not shown), a second mask, word line trenches, first insulating structures (not shown), semiconductor structures, first source/drain zones, channel zones, second source/drain zones, channel stop regions, a gate dielectric, gate electrodes and word lines have been produced, wherein the cross-section proceeds parallel to the insulation trenches.

Subsequently, an approximately 10 nm thick gate dielectric GDc is produced by thermal oxidation. A respective word line is produced in the word line trenches GWc by deposition of polysilicon n-doped in situ in a thickness of approximately 400 nm and by re-etching. Parts of the word lines that adjoin the first sidewalls of the word line trenches GWc in the area of the channel zones KAc act as gate electrodes GAc of selection transistors (see FIG. 7). Subsequently and analogous to the first exemplary embodiment, a second insulating structure, contacts, first capacitor electrodes, a capacitor dielectric, second capacitor electrodes and bit lines are produced.

In a fourth exemplary embodiment, an initial material is a fourth substrate 1d that contains p-doped silicon and whose dopant concentration amounts to approximately 10$^{15}$ cm$^{-3}$. A 500 nm thick, first n-doped layer S1d is produced by epitaxy. An approximately 450 nm thick, second p-doped layer S2d is produced thereover by epitaxy. The dopant concentration of the first doped layer S1d amounts to approximately 5×20$^{20}$ cm$^{-3}$. The dopant concentration of the second doped layer S2d amounts to approximate 5×10$^{17}$ cm$^{-3}$.

Figure 8:
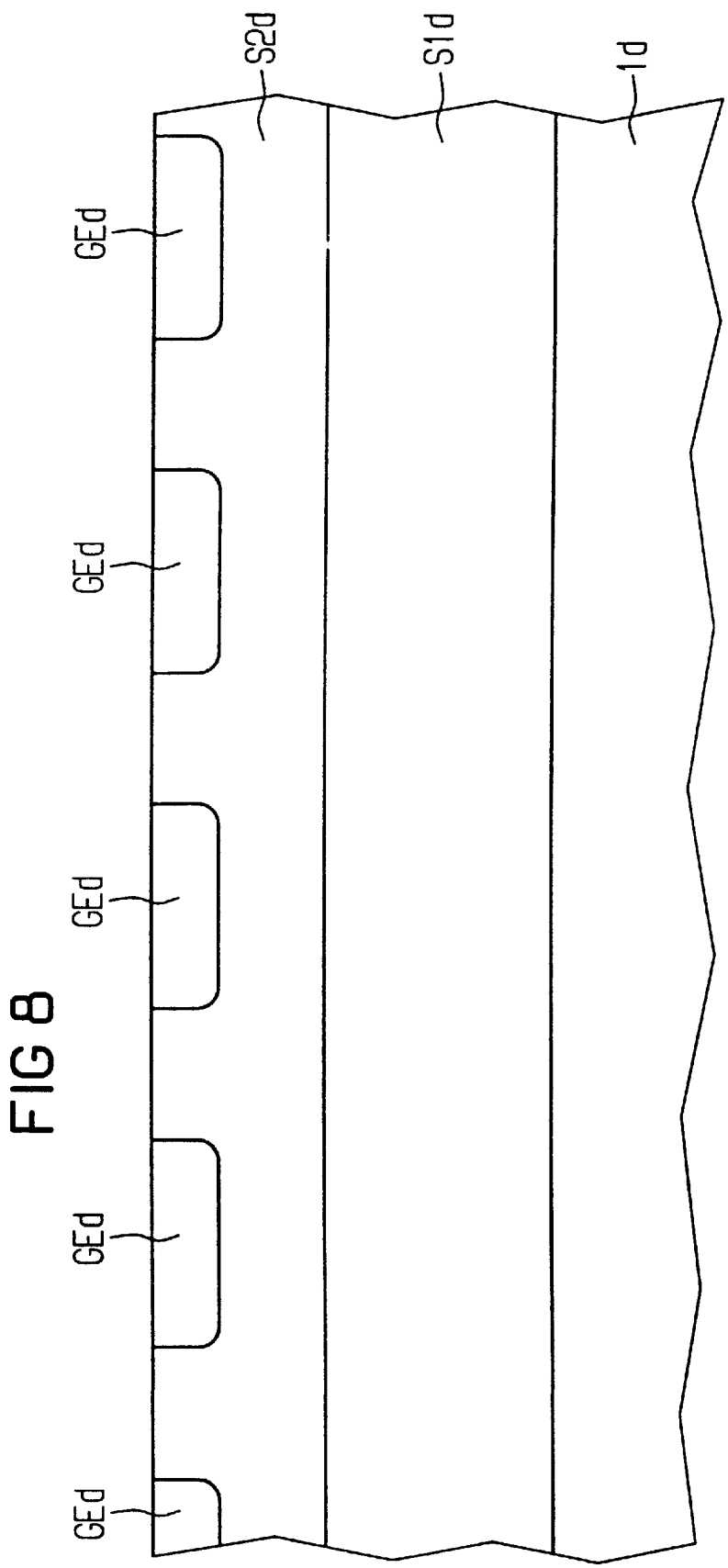
FIG. 8 shows a cross-section through a fourth substrate after a first doped layer, a second doped layer and stripe-shaped doped regions have been produced, wherein the cross-section proceeds perpendicular to the stripes of the stripe-shaped regions.

With the assistance of a stripe-shaped, first mask (not shown) of photoresist, stripe-shaped, doped regions GEd are produced by implantation in the second doped layer S2d (see FIG. 8). The stripe-shaped regions GEd are approximately 100 nm deep and their dopant concentration amounts to approximately 5×10$^{20}$ cm$^{-3}$. The stripe-shaped regions GEd are n-doped. The dopant of the stripe-shaped, doped regions GEd is activated by a tampering.

Subsequently and analogous to the first exemplary embodiment, a mask M2d analogous to the second mask M2a and word line trenches GWd are produced. Since no insulation trenches are produced, stripe-shaped semiconductor structures are formed between the word line trenches GWd. The word line trenches GWd proceed transverse to the stripe-shaped, doped regions GEd. The word line trenches GWd part the stripe-shaped regions GEd. First source/drain zones S/D1d with rectangular cross-sections thereby arise from the stripe-shaped, doped regions GEd.

Figure 9B:
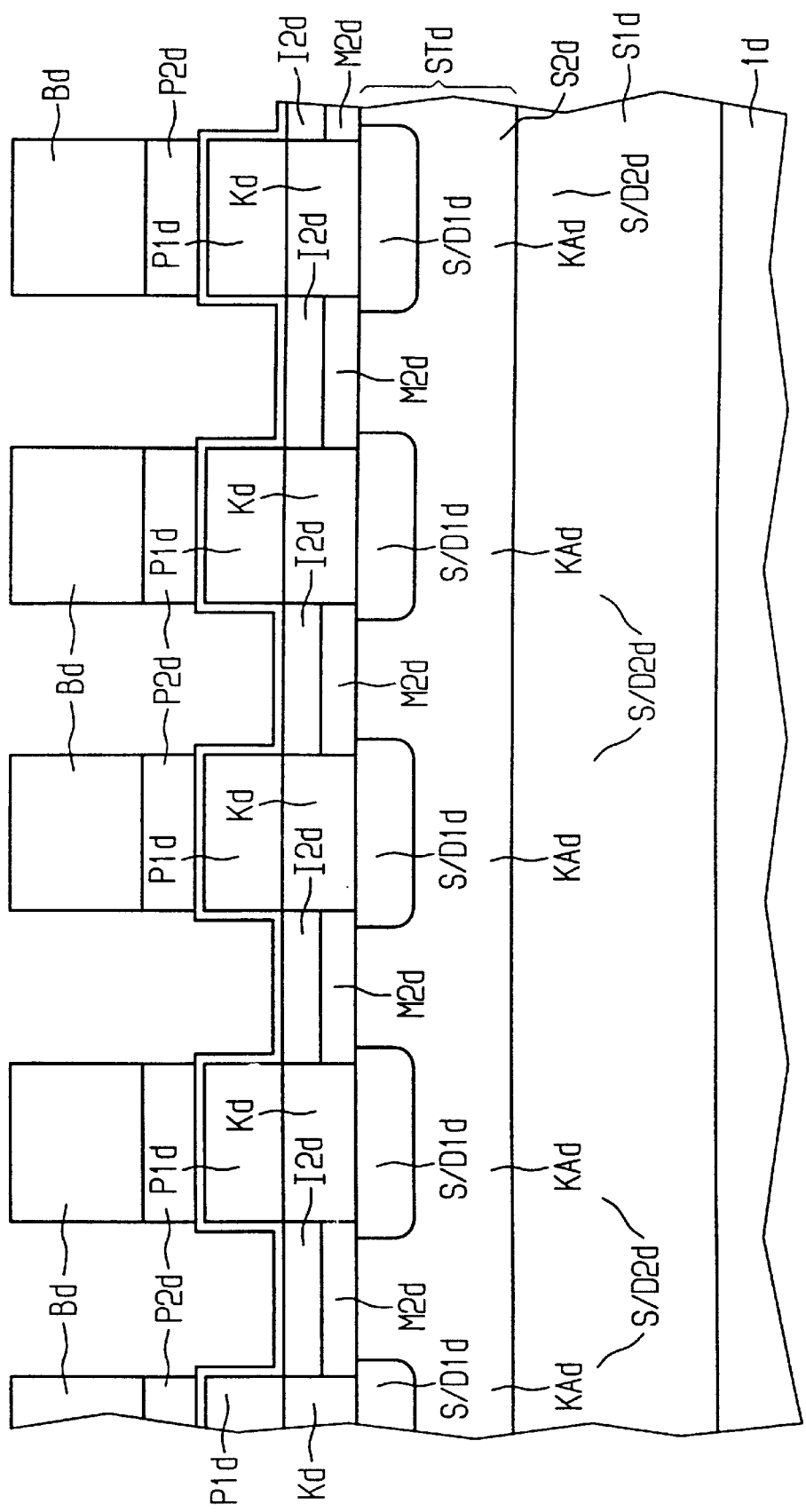

With the assistance of a stripe-shaped, second mask of photoresist (not shown), whose stripes proceed parallel to the stripe-shaped regions GEd, that covers every second stripe-shaped, doped region GEd, channel stop regions Cd are produced adjoining the first sidewalls of the word line trenches GWd, being produced by oblique implantation. The second mask of photoresist is removed. With the assistance of a third stripe-shaped mask of photoresist (not shown) that covers every second stripe-shaped region GEd that was not covered by the second mask of photoresist, channel stop regions Cd are produced adjoining second sidewalls of the word line trenches GWd. A part of the channel stop regions Cd adjoins parts of both the first sidewalls and the second sidewalls of the word line trenches GWd, wherein these parts are arranged between first source/drain zones S/D1d that neighbor a word line trench GWd. This part of the channel stop regions Cd prevents channels from forming between the first source/drain zones S/D1d neighboring one another along the word line trenches GWd. Each semiconductor structure STd includes memory cells neighboring one another along a word line trench GWd. The memory cells neighboring one another along the word line trench GWd are separated from one another by the above-described part of the channel stop regions Cd. Parts of the second doped layer S2d that are arranged under the first source/drain source S/D1 serve as channel zones KAd. In the region of the channel zones KAd, the channel stop regions Cd adjoin either the first sidewalls or the second sidewalls of the word line trenches GWd in alternation. Subsequently and analogous to the first exemplary embodiment, a gate dielectric GDd, gate electrodes GAd, word lines, an insulating structure I2d, contacts Kd, first capacitor electrodes P1d, a capacitor dielectric KDd, second capacitor electrodes P2d and bit lines Bd are produced (see FIGS. 9a and 9b).

In a fifth exemplary embodiment, an initial material is a fifth substrate 1e that contains p-doped silicon and whose dopant concentration amounts to approximately 10$^{15}$ cm$^{-3}$. By implantation, an approximately 1 μm deep, p-doped well We is produced (see FIG. 10). The dopant concentration of the well We amounts to approximately $10^{17}$ cm$^{-3}$. Analogous to the fourth exemplary embodiment, stripe-shaped, doped regions are produced.

A first auxiliary layer H1 is produced by deposition of SiO$_2$ in a thickness of approximately 100 nm. A second auxiliary layer H2 is produced by deposition of polysilicon doped in situ in a thickness of approximately 100 nm. As in the first exemplary embodiment, SiO$_2$ is deposited in a thickness of approximately 100 nm and is structured for producing a mask M2e analogous to the second mask M2a. Analogous to the mask M2e, the first auxiliary layer H1 and the second auxiliary layer H2 are also structured.

Figure 10:
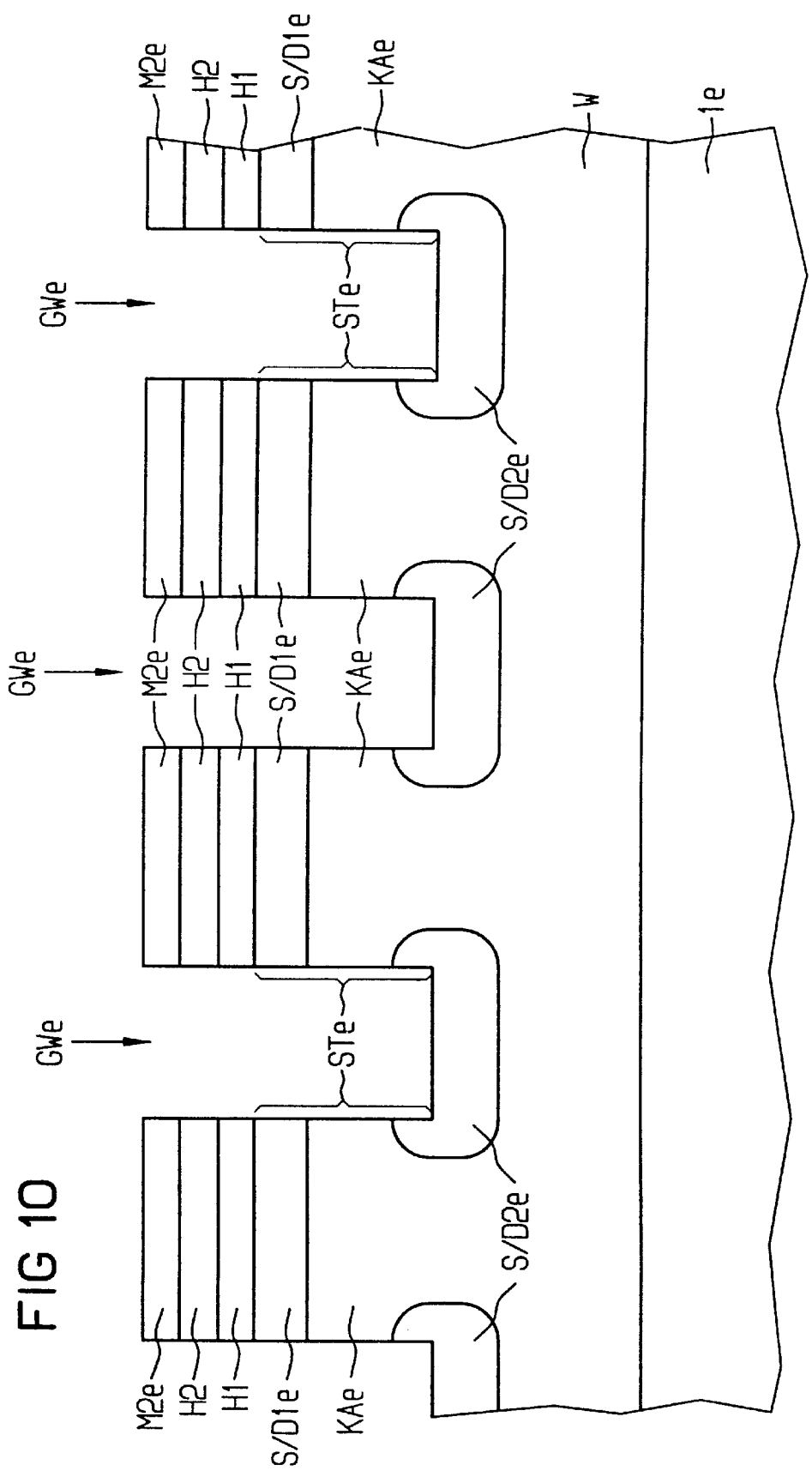
FIG. 10 shows a cross-section through a fifth substrate after stripe-shaped doped regions, a first auxiliary layer, a second auxiliary layer, a mask, word line trenches, semiconductor structures, first source/drain zones, channel zones and second source/drain zones have been produced, wherein the cross-section proceeds parallel to the stripe-shaped regions.

As the first exemplary embodiment, word line trenches GWe are produced with the assistance of the mask M2e by etching silicon selectively to SiO$_2$ (see FIG. 10). First source/drain zones S/D1e are thereby formed from the stripe-shaped, doped regions. Stripe-shaped semiconductor structures STe arise between the word line trenches GWe.

For protecting the sidewalls of the word line trenches GWe, SiO$_2$ is deposited in a thickness of approximately 50 nm and is re-etched, as a result whereof protective spacers (not shown) are formed at the sidewalls of the word line trenches GWe. The protective spacers protect the sidewalls of the word line trenches GWe in the following implantation of the floors of the word line trenches GWe. Second source/drain zones S/D2e thereby arise adjoining the floors of the word line trenches GWe. The second source/drain zones S/D2e are approximately 100 nm deep and their dopant concentration amounts to approximately $5 \times 10^{20}$ cm$^{-3}$. They are n-doped. Their dopant is activated by tempering. The protective spacers are, in turn, removed with the assistance of HF as etchant.

Figure 11:
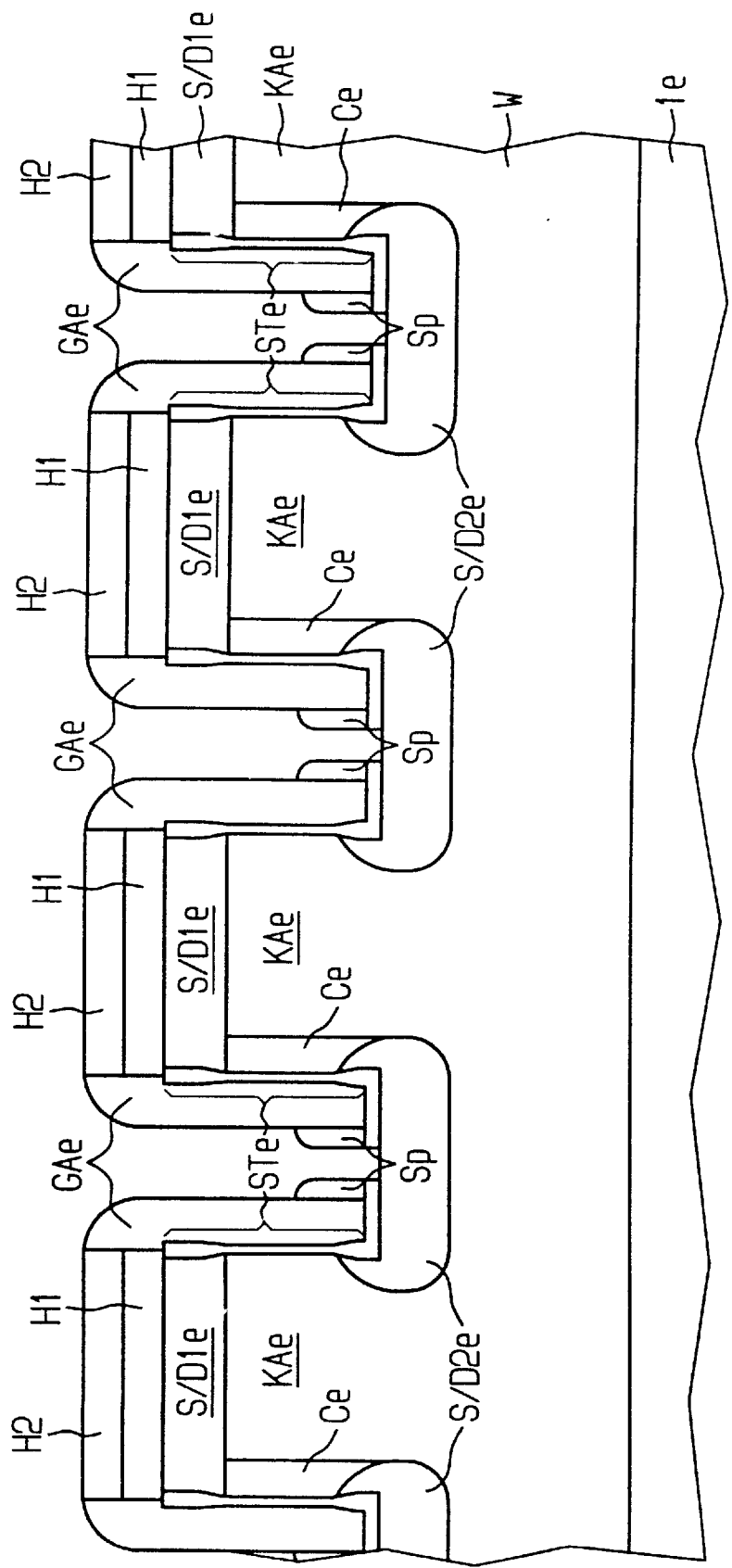
FIG. 11 shows the cross-section of FIG. 10 after channel stop regions, a gate dielectric, gate electrodes, word lines and spacers have been produced, the mask has been removed and a part of the floors of the word line trenches have been uncovered.
Figure 12:
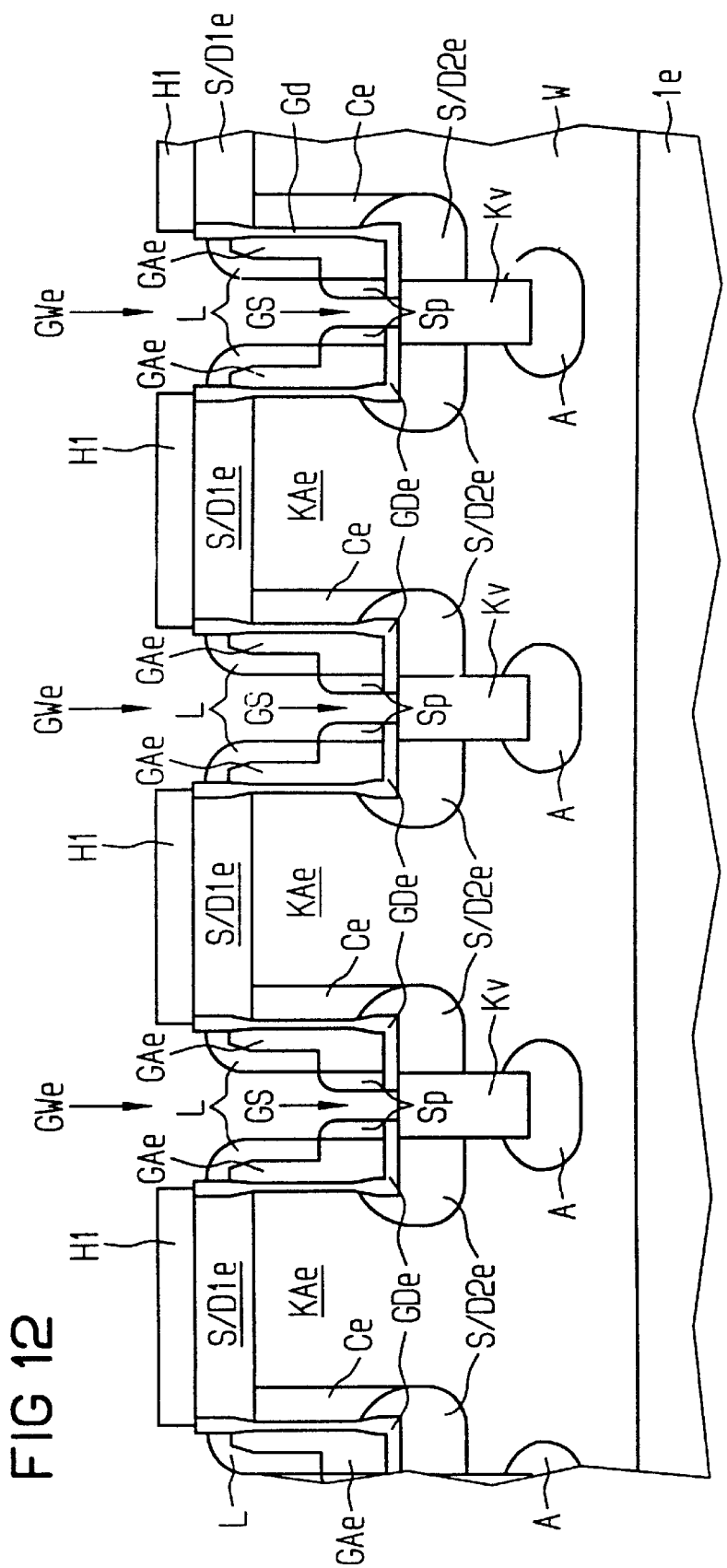
FIG. 12 shows the cross-section of FIG. 11 at the narrow trenches, buried contacts and doped terminal regions have been produced.

Analogous to the fourth exemplary embodiment, channel stop regions Ce, a gate dielectric GDe, gate electrodes GAe and word lines are produced. Subsequently, SiO$_2$ is deposited in a thickness of approximately 50 nm and is etched back approximately 400 nm deep, as a result whereof spacers Sp adjoining the word lines are formed. The mask M2e and parts of the gate dielectric GDe arranged at the floors of the word line trenches GWe are thereby removed (see FIG. 11). The second auxiliary layer H2 thereby protects the first auxiliary layer H1. By etching silicon selectively to SiO$_2$, approximately 300 nm deep, narrow trenches GS are produced in the uncovered parts of the floors of the word line trenches GWe. For example, HBr+NF$_3$+He+O$_2$ is suitable as etchant. The second auxiliary layer H2 is thereby removed. The first auxiliary layer H1 protects the semiconductor structures STe. Doped terminal regions A within the well We are produced adjoining the floors of the narrow trenches GS by an implantation with p-doping ions, wherein the dopant concentration amounts to approximately $5 \times 10^{19}$ cm$^{-3}$. For producing buried contacts Kv that connect the terminal regions A to the second source/drain zones S/D2e, titanium is deposited in a thickness of approximately 50 nm and tempered such that titanium silicide arises. Remaining titanium is subsequently removed with, for example, NH$_3$+ H$_2$O$_2$. As a result of this selective silicidation, parts of the word lines are silicized. These parts form conductive structures L (see FIG. 12).

Figure 13:
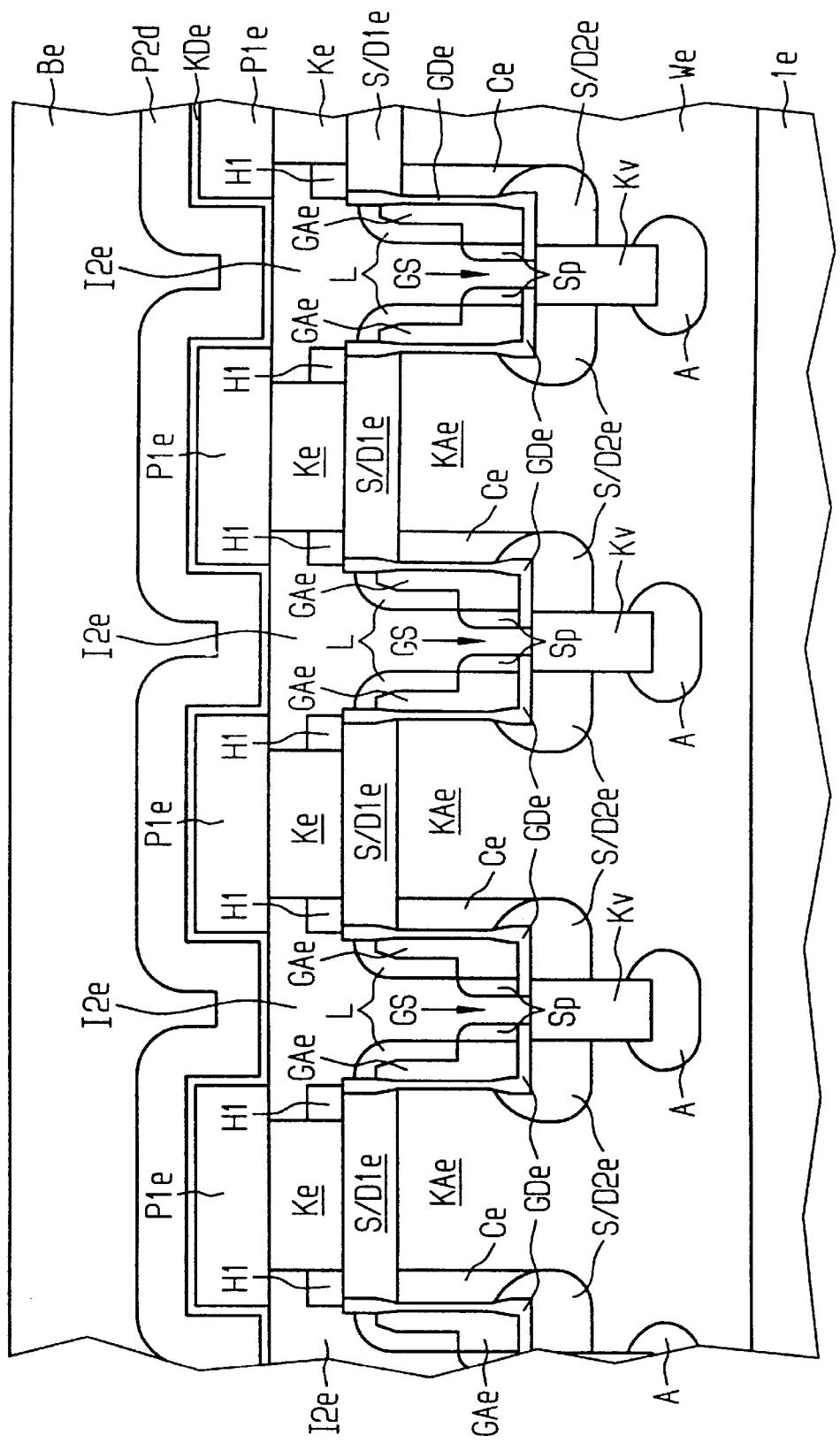
FIG. 13 shows the cross-section of FIG. 12 after an insulating structure, contacts, first capacitor electrodes, a capacitor dielectric, second capacitor electrodes and bit lines have been produced.

Subsequently and analogous to the first exemplary embodiment, an insulating structure I2e, contacts Ke, first capacitor electrodes P1e, a capacitor dielectric KDe, second capacitor electrodes P2e and bit lines Be are produced (see FIG. 13). Parts of the well We that are located under the first source/drain zones S/D1e act as channel zones KAe.

In a sixth exemplary embodiment, an initial material is a sixth substrate 1f that contains p-doped silicon and whose dopant concentration amounts to approximately $10^{15}$ cm$^{-3}$. Analogous to the fifth exemplary embodiment, a well Wf is produced. By implantation with n-doping ions, an approximately 100 nm deep, doped layer is produced service-wide. The dopant concentration of the doped layer amounts to approximately $5 \times 10^{20}$ cm$^{-3}$. The dopant of the doped layer is activated by tampering.

Analogous to the first exemplary embodiment, insulation trenches GIf are produced with the assistance of a first mask (not shown). By deposition of SiO$_2$ in a thickness of approximately 50 nm and re-etching, protective spacers (not shown) are produced at sidewalls of the insulation trenches GIf. The protective spacers protect the sidewalls of the insulation trenches GIf and the following implantation with n-doping ions. First parts of a grid-shaped, doped region GGf are thereby formed along the floors of the insulation trenches GIf. The first parts of the grid-shaped region GGf are stripe-shaped and their vertical dimension amounts to approximately 100 nm (see FIG. 14). Their dopant concentration amounts to approximately $5 \times 10^{20}$ cm$^{-3}$. The dopant of the first parts of the grid-shaped region GGf is activated by a tampering step.

Figure 15A:
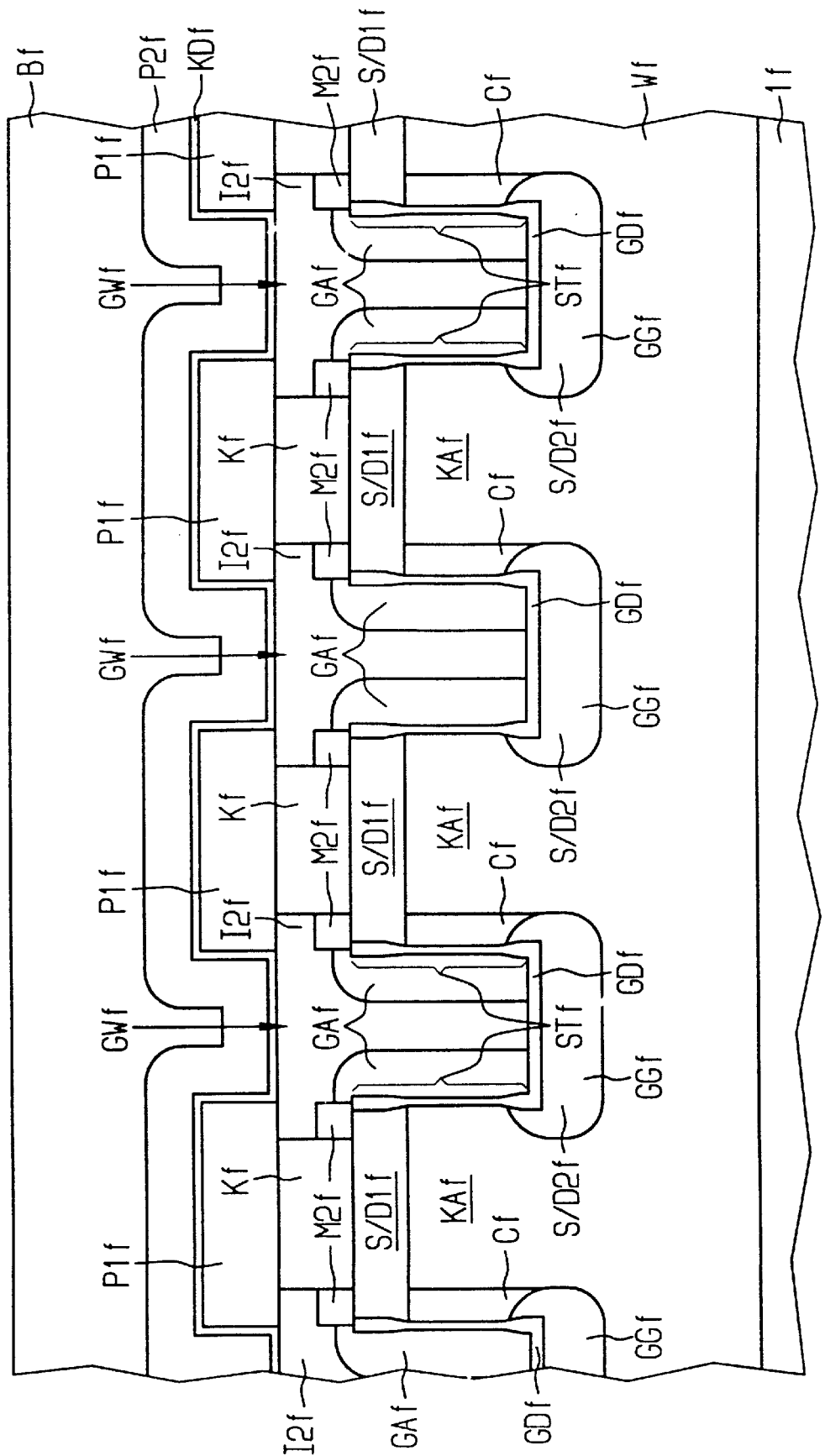
FIG. 15a shows a cross-section perpendicular to the cross-section of FIG. 14 at the channel stop regions, a gate dielectric, gate electrodes, word lines, a second insulating structure, contacts, first capacitor electrodes, a capacitor dielectric, second capacitor electrodes and bit lines have been produced.

Analogous to the first exemplary embodiment, the insulation trenches GIf are filled with SiO$_2$ and word line trenches GWf are produced with the assistance of a second mask M2f, wherein first insulating structures I1f are formed in the insulation trenches IGf. First source/drain zones S/D1f that are parts of cuboid-shaped semiconductor structures STf arise from the doped layer. Parts of the well Wf arranged under the first source/drain zones S/D1f act as channel zones KAf. SiO$_2$ is deposited in a thickness of approximately 50 nm and re-etched for producing protective spacers. The protective spacers protect sidewalls of the word line trenches GWf in the following implantation with n-doping ions. A second part of the grid-shaped region GGf is thereby formed along the floors of the word line trenches GWf, the dopant thereof being activated by tampering. The dopant concentration of the grid-shaped, doped region GGf amounts to approximately $5 \times 10^{20}$ cm$^{-3}$. Parts of the grid-shaped, doped region GGf arranged under the channel zones KAf act as second source/drain zones S/D2f. The protective spacers are subsequently removed. Analogous to the first exemplary embodiment, channel stop regions Cf, a gate dielectric GDf, gate electrodes GAf, word lines, a second insulating structure I2f, contacts Kf, first capacitor electrodes P1f, a capacitor dielectric KDf, second capacitor electrodes P2f and bit lines Bf are produced (see FIGS. 15a and 15b).

Many variations of the exemplary embodiments that likewise lie within the scope of the present invention are conceivable. In particular, the dimensions of the described layers, trenches, masks, spacers, zones and structures can be adapted to the respective requirements as desired. The same is also true of the dopant concentrations that have been proposed.

Features of the sixth exemplary embodiments can be combined with one another. The self-aligned production of the contacts described in the second exemplary embodiment can also be applied to the fifth exemplary embodiments. The first auxiliary layer would then have to be produced over the second layer.

Although the present invention has been described with reference to specific embodiments, those of skill in the art will recognize that changes may be made thereto without departing from the spirit and scope of the invention as set forth in the hereafter appended claims.

We claim as our invention:

1. A DRAM cell arrangement, comprising:
   a projection-like semiconductor structure, the semiconductor structure laterally limited by at least one first sidewall and one second sidewall lying opposite the first sidewall;
   a first source/drain zone arranged in the semiconductor structure;
   at least one vertical MOS transistor of a memory cell, a channel zone of the least one vertical MOS transistor arranged under the first source/drain zone and adjoining at least the first sidewall of the semiconductor structure;
   a gate dielectric provided in at least the first sidewall of the semiconductor structure at least in a region of the channel zone of the MOS transistor;
   a gate electrode that is electrically connected to a first word line adjoining the gate dielectric;
   an element arranged between the channel zone and a second word line, the element preventing the drive of the MOS transistor by the second word line and adjoining the second sidewall of the semiconductor structure;
   a first capacitor electrode of a capacitor electrically connected to the first source/drain zone of the MOS transistor; and
   a capacitor dielectric arranged above the first capacitor electrode and a second capacitor electrode of the capacitor arranged above the capacitor dielectric and being electrically connected to a bit line that proceeds transverse to the first word line.

2. A DRAM cell arrangement as claimed in claim 1, wherein the element that prevents the drive of the MOS transistor by the second word line arranged at the element is a channel stop region that exhibits the same conductivity type as the channel zone, but exhibits a higher dopant concentration than that of the channel zone.

3. A DRAM cell arrangement as claimed in claim 1, further comprising:
   a plurality of word line trenches, each word line trench arranged between two semiconductor structures neighboring one another, wherein two sidewalls of the word line trenches proceed parallel to the first sidewall and to the second sidewall of the semiconductor structure, wherein one of the word lines proceeds along each of the two sidewalls of the word line trench, wherein the elements that prevent the drive of MOS transistors by word lines arranged at the elements in memory cells that neighbor one another along one of the word line trenches ultimately adjoin a second sidewall of the word line trench and a first sidewall of a neighboring word line trench, wherein the gate electrode of MOS transistors of every second one of the memory cells neighboring along the word line trench are connected to the first word line, and wherein the gate electrodes are parts of the word lines.

4. A DRAM cell arrangement as claimed in claim 3, wherein the elements that prevent the drive of MOS transistors by word lines arranged at the elements in memory cells neighboring one another along the bit line are arranged all adjacent to one of first sidewalls and second sidewalls of the word line trenches.

5. A DRAM cell arrangement as claimed in claim 1, wherein word lines are arranged in word line trenches that separate semiconductor structures from one another, wherein a respective word line proceeds along the word line trenches, wherein the elements that prevent the drive of MOS transistors by word lines arranged at the elements in memory cells neighboring one another along the bit line are all adjacent to one of first sidewalls and second sidewalls of the word line trenches, wherein the gate electrodes of MOS transistors of memory cells neighboring one another along one of the word line trenches are electrically connected to the first word line, and wherein the gate electrodes are parts of the word lines.

6. A DRAM cell arrangement as claimed in claim 5, wherein the elements that prevent the drive of MOS transistors by word lines arranged at the elements all adjoin one of first sidewalls and second sidewalls of the word line trenches.

7. A DRAM cell arrangement as claimed in claim 1, wherein the memory cell includes the semiconductor structure, wherein the semiconductor structure is formed as a projection of a substrate, wherein insulating structures are arranged between semiconductor structures neighboring one another along the first word line, and wherein the insulating structures prevent the formation of a channel between first source/drain zones that are arranged in the semiconductor structures.

8. A DRAM cell arrangement as claimed in claim 1, wherein the semiconductor structure is substantially stripe-shaped and is part of the memory cells neighboring one another along the first word line, wherein further elements that prevent the drive of MOS transistors by word lines arranged at the elements adjoin parts of the first sidewalls and the second sidewall of the semiconductor structure such that the parts are located between memory cells neighboring one another along the first word line.

9. A DRAM cell arrangement as claimed in claim 1, further comprising:
   a second source/drain zone arranged under the channel zone, wherein the second source/drain zone is part of a doped layer.

* * * * *